United States Patent
Sakurai et al.

(10) Patent No.: US 11,130,856 B2
(45) Date of Patent: Sep. 28, 2021

(54) RESIN COMPOSITION AND METHOD OF FORMING RESIST PATTERN

(71) Applicant: JSR CORPORATION, Tokyo (JP)

(72) Inventors: Tomohiko Sakurai, Tokyo (JP); Sosuke Osawa, Tokyo (JP); Hiromitsu Nakashima, Tokyo (JP)

(73) Assignee: JSR Corporation, Tokyo (JP)

( * ) Notice: Subject to any disclaimer, the term of this patent is extended or adjusted under 35 U.S.C. 154(b) by 240 days.

(21) Appl. No.: 16/395,337

(22) Filed: Apr. 26, 2019

(65) Prior Publication Data

US 2019/0249000 A1 Aug. 15, 2019

Related U.S. Application Data

(63) Continuation-in-part of application No. PCT/JP2017/038925, filed on Oct. 27, 2017.

(30) Foreign Application Priority Data

Nov. 1, 2016 (JP) .............................. JP2016-214278

(51) Int. Cl.
| | |
|---|---|
| *C08L 41/00* | (2006.01) |
| *G03F 7/11* | (2006.01) |
| *C08L 101/04* | (2006.01) |
| *C08L 101/08* | (2006.01) |
| *G03F 7/039* | (2006.01) |
| *H01L 21/027* | (2006.01) |
| *C08L 101/06* | (2006.01) |
| *G03F 7/20* | (2006.01) |
| *G03F 7/004* | (2006.01) |
| *G03F 7/38* | (2006.01) |

(52) U.S. Cl.
CPC ............. *C08L 41/00* (2013.01); *C08L 101/04* (2013.01); *C08L 101/06* (2013.01); *C08L 101/08* (2013.01); *G03F 7/039* (2013.01); *G03F 7/11* (2013.01); *G03F 7/2041* (2013.01); *G03F 7/38* (2013.01); *H01L 21/027* (2013.01); *G03F 7/0045* (2013.01)

(58) Field of Classification Search
CPC ........... G03F 7/2041; G03F 7/11; C08L 41/00
See application file for complete search history.

(56) References Cited

U.S. PATENT DOCUMENTS

| | | | |
|---|---|---|---|
| 2010/0255416 A1 | 10/2010 | Kouno et al. | |
| 2013/0217850 A1* | 8/2013 | Tanaka | C08F 20/28 526/244 |
| 2014/0248563 A1 | 9/2014 | Tanaka et al. | |

FOREIGN PATENT DOCUMENTS

| | | |
|---|---|---|
| JP | 5229228 B2 | 7/2013 |
| JP | 5991325 B2 | 9/2016 |
| TW | 201224664 A | 6/2012 |
| WO | WO 2012/043762 A1 | 4/2012 |
| WO | WO 2013/047044 A1 | 4/2013 |
| WO | WO 2013/069750 A1 | 5/2013 |

OTHER PUBLICATIONS

Combined Taiwanese Office Action and Search Report dated Jan. 29, 2021 in Patent Application No. 106137481, 21 pages (with English translation).
International Search Report dated Jan. 30, 2018, in PCT/JP2017/038925.
International Preliminary Report on Patentability and Written Opinion dated May 16, 2019 in PCT/JP2017/038925 (English Translation only), 8 pages.
Office Action dated May 14, 2021 in Japanese Patent Application No. 2018-548981 (with English translation), 6 pages.

* cited by examiner

*Primary Examiner* — John A McPherson
*Assistant Examiner* — Nicholas E Brown
(74) *Attorney, Agent, or Firm* — Element IP, PLC

(57) ABSTRACT

A resin composition includes a resin A, a resin C, and a solvent. The resin A includes a sulfonic-acid-group-containing structural unit in an amount exceeding 5 mol % with respect to total structural units included in the resin A. The resin A has a content of a fluorine atom of 30 mass % or less with respect to a total mass of the resin A. The resin C includes a fluorine atom in a larger content per unit mass than the content of a fluorine atom per unit mass in the resin A. A content of the resin A in the resin composition is lower than a content of the resin C in the resin composition in terms of mass.

22 Claims, No Drawings

RESIN COMPOSITION AND METHOD OF FORMING RESIST PATTERN

CROSS-REFERENCE TO RELATED APPLICATIONS

The present application is a continuation-in-part application of International Application No. PCT/JP2017/038925, filed Oct. 27, 2017, which claims priority to Japanese Patent Application No. 2016-214278, filed Nov. 1, 2016. The contents of these applications are incorporated herein by reference in their entirety.

BACKGROUND OF THE INVENTION

Field of the Invention

The present invention relates to a resin composition and a method of forming a resist pattern.

Description of the Related Art

A photolithography technique using a resist material is employed in forming a fine circuit in a semiconductor element. According to this, for example, an acid is generated by exposure using radiation via a mask pattern on a coating film of the resist material, and difference in solubility to a development liquid of the resist material is generated at the exposed part and at the non-exposed part by reaction using the acid as a catalyst, thereby to form a resist pattern on a substrate.

In the above photolithography technique, miniaturization of the circuit is achieved by using a short-wavelength radiation such as an excimer laser; however, further miniaturization is demanded due to the needs for scale reduction and higher capacity. Accordingly, as a miniaturization application technique, a liquid immersion lithography method is used that performs exposure in a state in which a space between the lens of an exposure apparatus and the resist film is filled with a liquid medium. According to this liquid immersion lithography method, the aforementioned space is filled with a liquid medium (for example, water) having a larger refractive index (n) in place of a gas such as air or nitrogen, so that the numerical aperture increases, and resolution and focal depth can be improved.

In forming a resist pattern using the liquid immersion lithography method, deficiency such as elution of the resist film or deterioration in development properties may occur when the liquid medium such as water is used. In order to solve this problem, a technique of using a water-repellent upper layer film as a protective film on the resist film is known. However, when in particular a water-based alkali development liquid is used as the development liquid, solubility to the development liquid decreases even when the upper layer film is made water-repellent, thereby raising a problem of causing residue defects. As means for solving this problem, a technique of forming a water-repellent upper layer film using a resin having a strongly acidic group is proposed (see, Japanese Patent No. 5229228).

According to the above technique, the residue defects are suppressed by promoting the development liquid solubility of a layer formed by intermixing of the resist film and the upper layer film around the interface between the two layers (this layer may hereafter be referred to as "mixing layer") by action of the strongly acidic group introduced into the resin that forms the resist upper layer film.

SUMMARY OF THE INVENTION

According to an aspect of the present invention, a resin composition includes a resin A, a resin C, and a solvent. The resin A includes a sulfonic-acid-group-containing structural unit in an amount exceeding 5 mol % with respect to total structural units included in the resin A. The resin A has a content of a fluorine atom of 30 mass % or less with respect to a total mass of the resin A. The resin C includes a fluorine atom in a larger content per unit mass than the content of a fluorine atom per unit mass in the resin A. A content of the resin A in the resin composition is lower than a content of the resin C in the resin composition in terms of mass.

According to another aspect of the present invention, a method of forming a resist pattern includes applying a photoresist composition on a substrate to form a resist film on the substrate. The resin composition is applied on the resist film to form a liquid immersion upper layer film on the resist film. Liquid immersion exposure is performed on the resist film on which the liquid immersion upper layer film is formed. The resist film is developed after the liquid immersion exposure.

According to further aspect of the present invention, a method of forming a resist pattern includes applying a photoresist composition on a substrate to form a resist film on the substrate. The resist film is exposed. The exposed resist film is developed with an alkali development liquid. The method further includes applying the resin composition on a surface of the resist film after the resist film is formed and before the exposed resist film is developed.

DETAILED DESCRIPTION OF THE PREFERRED EMBODIMENTS

In one embodiment, the present invention relates to a resin composition including:

a resin A that contains a sulfonic-acid-group-containing structural unit in an amount exceeding 5 mol % with respect to total structural units included in the resin A, the resin A having a content of a fluorine atom of 30 mass or less with respect to a total mass of the resin A;

a resin C that contains a fluorine atom in a larger content per unit mass than the content of a fluorine atom per unit mass in the resin A; and a solvent, wherein a content of the resin A in the resin composition is lower than a content of the resin C in the resin composition in terms of mass.

In the resin composition, the highly acidic resin A that contains a structural unit having a sulfonic acid group, which is a strongly acidic group, in a predetermined amount or more and has a content of a fluorine atom in a predetermined amount or less with respect to a total mass of the resin A is liable to be locally distributed around the interface between the resist film and the protective film that is formed on the resist film using the resin composition, so that the residue defects can be suppressed by promoting the development liquid solubility of the mixing layer. At the same time, the highly water-repellent resin C that contains a fluorine atom in a larger content per unit mass than the content of a fluorine atom per unit mass in the resin A is liable to be locally distributed on the surface of the protective film and exhibits the water repellency. In the resin composition, the content of the highly acidic resin A is set to be lower than the content of the highly water-repellent resin C, so that the decrease in water repellency of the protective film on the resist film can be efficiently suppressed, and the water mark defects on the resist film can be prevented. Further, in the case of a so-called dry exposure other than the liquid immersion exposure, a mixing layer is formed by the resin composition and a component having a low surface free energy that is liable to be locally distributed on the surface of the resist film, whereby solubility of the resist film to the development liquid can be promoted, and the residue defects can be suppressed. In particular, when the resist film contains a fluorine-containing polymer, dissolution of the fluorine-containing polymer having a relatively lower solubility to the alkali development liquid can be promoted when the resin composition forms the mixing layer, so that larger effects can be expected in suppressing the residue defects. Furthermore, due to water repellency of the protective film, swelling of the pattern by the alkali development liquid can be prevented, thereby improving the pattern shape.

In the resin composition, it is preferable that the content of the resin A in a total mass of resin solid components of the resin composition be 0.1 mass % or more and less than 5 mass %. By setting the content of the highly acidic resin A to be within the aforementioned range, residue defect preventability and water mark defect preventability can be made compatible with each other at a high level.

In the resin composition, it is preferable that the content of the resin C in a total mass of resin solid components of the resin composition be 10 mass % or more and 98 mass % or less. By setting the content of the highly water-repellent resin C to be within the aforementioned range, the receding contact angle of water of the upper layer film can be enhanced, and the water mark defect preventability can be further improved.

In the resin composition, it is preferable that the amount of a fluorine atom in the resin A with respect to a total mass of the resin A is 0 mass or more and less than 30 mass %, and the amount of a fluorine atom in the resin C with respect to a total mass of the resin C exceeds 40 mass %.

The upper layer film composition preferably further includes a resin B that contains a sulfonic-acid-group-containing structural unit in an amount exceeding 0 mol % and being 5 mol % or less with respect to total structural units included in the resin B and has a content of a fluorine atom per unit mass smaller than the content of a fluorine atom per unit mass in the resin C. The lowly acidic and lowly water-repellent resin B has an intermediate property that lies between the property of the resin A and the property of the resin C in view of acidity and water repellency. Such a resin B is liable to be locally distributed between the region of the locally distributed resin A around the interface between the upper layer film and the resist film and the region of the locally distributed resin C around the upper layer film surface, and can form an intermediate region that connects between the two. As a result, the development liquid solubility derived from the highly acidic resin A and the water repellency derived from the highly water-repellent resin C can be exhibited with a better balance.

In the resin composition, it is preferable that the resin A do not contain a fluorine atom. This can promote the local distribution of the resin A in a neighborhood of the resist film surface and the local distribution of the resin C in a neighborhood of the upper layer film surface, whereby the water repellency of the upper layer film and the development liquid solubility of the resist film can be further enhanced.

In the resin composition, it is preferable that the resin C do not contain a sulfonic-acid-group-containing structural unit. This configuration can suppress decrease in the water repellency of the upper layer film and can prevent the water mark defects more efficiently.

In the resin composition, the resin A may further have a carboxyl-group-containing structural unit. When the resin A has such an acidic group, control of the acidity of the resin A, local distribution of the resin A to the resist film side, removal of the upper layer film by the development liquid, and the like can be improved.

It is preferable that the receding contact angle of a film formed from the resin composition, with respect to water, be 80° or more. When the upper layer film has a receding contact angle within the aforementioned range, the water mark defects can be more efficiently prevented. Here, in the present specification, the receding contact angle is a contact angle to the resist upper layer film at an end point in the rear, as viewed in the moving direction, of the water droplet. According as the water repellency or hydrophobicity of the upper layer film surface is higher, the receding contact angle assumes a higher value.

In the resin composition, it is preferable that the sulfonic-acid-group-containing structural unit in one or both of the resin A and the resin B be represented by the following Formula (1):

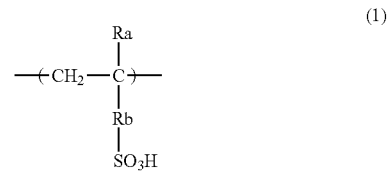

(in the Formula (1), Ra is a hydrogen atom or a methyl group, and Rb is a single bond, an oxygen atom, a sulfur atom, or a divalent organic group).

The sulfonic-acid-group-containing structural unit represented by the above Formula (1) can improve the residue defect preventability.

In one embodiment, the present invention relates to a resist upper layer film forming resin composition containing the resin composition described above. Since the resist upper layer film forming resin composition (which may hereafter be referred to as "upper layer film composition") contains the resin composition described above, excellent residue defect preventability and excellent water mark defect preventability can be exhibited as the upper layer film formed on the resist film. In other words, the aforementioned resin composition can be suitably used as the resist upper layer film forming resin composition.

In another embodiment, the present invention relates to a method of forming a resist pattern, including:

applying a photoresist composition on a substrate to form a resist film on the substrate;

applying the resin composition on the resist film to form a liquid immersion upper layer film on the resist film;

performing liquid immersion exposure on the resist film on which the liquid immersion upper layer film is formed; and developing the resist film after the liquid immersion exposure.

The resist pattern forming method according to the embodiment forms the resist pattern while preventing water mark defects and residue defects with use of the above resin composition as the resist upper layer film forming resin composition, so that the targeted resist pattern can be efficiently formed.

In one embodiment, the present invention relates to a development modifier of an alkali development resist, containing the resin composition described above. Since the development modifier contains the aforementioned resin composition, excellent residue defect preventability and excellent water mark defect preventability can be exhibited at the time of liquid immersion exposure as the protective film formed on the resist film. On the other hand, at the time of dry exposure, a mixing layer is formed by the resin composition and a component having a low surface free energy that is liable to be locally distributed on the surface of the resist film, whereby solubility of the resist film to the development liquid can be promoted, and the residue defects can be suppressed. In particular, when the resist film contains a fluorine-containing polymer, dissolution of the fluorine-containing polymer having a relatively lower solubility to the alkali development liquid can be promoted when the resin composition forms the mixing layer, so that larger effects can be expected in suppressing the residue defects. Also, due to water repellency of the protective film, swelling of the pattern by the alkali development liquid can be prevented, whereby a desired pattern formability can be imparted. In other words, the aforementioned resin composition can be suitably used as a development modifier.

In the present specification, the "alkali development resist" in a wide range of meaning refers to a resist capable of forming a positive-type or negative-type pattern due to change in solubility to the alkali development liquid by action of an acid, and in a narrow range of meaning refers to a resist whose solubility to the alkali development liquid increases by action of an acid. Also, the "development modifier" refers to an agent that can improve the pattern shape or decrease the residue defects or water mark defects by being applied to the surface of the resist film before the development step.

In still another embodiment, the present invention relates to a method of forming a resist pattern, including:

applying a photoresist composition on a substrate to form a resist film on the substrate;

exposing the resist film; and developing the exposed resist film with an alkali development liquid, and further including applying the resin composition on a surface of the resist film after the resist film is formed and before the exposed resist film is developed.

The resist pattern forming method according to the embodiment forms the resist pattern while improving the pattern shape and preventing water mark defects and residue defects with use of the above resin composition as the development modifier, so that the targeted resist pattern can be efficiently formed.

In the resist pattern forming method according to the embodiment, the exposure can be carried out suitably with an extreme ultraviolet ray. The pattern formed by using an extreme ultraviolet ray is extremely fine, and the influence of residue defects is large. By using the aforementioned resin composition as the development modifier, a mixing layer is formed by the resin composition and a component having a low surface free energy that is liable to be locally distributed on the surface of the resist film, whereby solubility of the resist film to the development liquid can be promoted, and the residue defects can be suppressed. In particular, when the resist film contains a fluorine-containing polymer, dissolution of the fluorine-containing polymer having a relatively lower solubility to the alkali development liquid can be promoted when the resin composition forms the mixing layer, so that larger effects can be expected in suppressing the residue defects. Also, in the step of developing after the exposure, the fine pattern is liable to be affected by the swelling of the alkali development liquid. By forming the protective film with use of the development modifier, swelling of the pattern by the alkali development liquid can be prevented, and an excellent pattern formability can be exhibited.

In the method of forming a resist pattern according to the embodiment, it is preferable that the photoresist composition contain a fluorine-atom-containing polymer. Owing to the oil-repellent characteristic caused by containing the fluorine atom, the fluorine-atom-containing polymer is liable to be locally distributed in the resist film surface layer when the resist film is formed. As a result of this, the components in the resist film can be prevented from migrating into the protective film of the development modifier.

<Resin Composition>

The resin composition according to the present embodiment contains the resin A, the resin C, and the solvent. Also, in the present embodiment, the content of the resin A in the resin composition is set to be smaller than the content of the resin C in the resin composition in terms of mass. The aforementioned resin composition may contain other additives as long as the effects of the present invention are not degraded. The aforementioned resin composition can be suitably used as a resist upper layer film forming resin composition or a development modifier. Hereafter, details will be described by mentioning each embodiment as an example.

<Resist Upper Layer Film Forming Resin Composition>

A resist upper layer film forming resin composition according to the present embodiment contains the resin composition described above.

(Resin A)

The resin A is a resin that contains a sulfonic-acid-group-containing structural unit in an amount exceeding 5 mol % with respect to total structural units included in the resin A and has having a content of a fluorine atom of 30 mass % or less with respect to a total mass of the resin A. It is sufficient that the content of the sulfonic-acid-group-containing structural unit in the resin A is within a range exceeding 5 mol % relative to the total structural units constituting the resin A, and is preferably 6 mol % or more, more preferably 7 mol % or more, and still more preferably 8 mol % or more. On the other hand, the content of the sulfonic-acid-group-containing structural unit in the resin A is preferably 50 mol % or less, more preferably 45 mol % or less, and still more preferably 40 mol % or less. By setting the content of the sulfonic-acid-group-containing structural unit in the resin A to be within the aforementioned range, decrease in the water repellency can be suppressed while improving the development properties of the resist film.

(Sulfonic-Acid-Group-Containing Structural Unit)

The sulfonic-acid-group-containing structural unit is preferably a structural unit represented by the following Formula (1) (which may hereafter be also referred to as "structural unit (1)", and the same applies to other structural units as well).

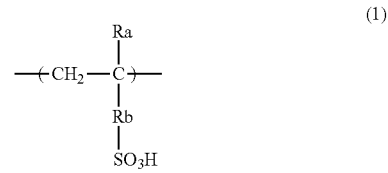

(in the Formula (1), Ra is a hydrogen atom or a methyl group, and Rb is a single bond, an oxygen atom, a sulfur atom, or a divalent organic group).

A hydrogen atom is preferable as Ra in view of copolymerizability and acidity.

The divalent organic group represented by Rb is preferably a divalent chain hydrocarbon group having one to six carbon atoms, a divalent alicyclic hydrocarbon group having four to twelve carbon atoms, a divalent aromatic hydrocarbon group having six to twelve carbon atoms, or —C(=O)—X'—R'— group. Here, X' is an oxygen atom, a sulfur atom, or an NH group. R' is a single bond, a divalent chain hydrocarbon group having one to six carbon atoms, a divalent alicyclic hydrocarbon group having four to twelve carbon atoms, or a divalent aromatic hydrocarbon group having six to twelve carbon atoms.

Examples of the divalent chain hydrocarbon group having one to six carbon atoms represented by the above Rb and R' include alkanediyl groups such as methanediyl group, ethanediyl group, and propanediyl group; alkenediyl groups such as ethenediyl group, propenediyl group, and butenediyl group; and alkynediyl groups such as ethynediyl group, propynediyl group, and butynediyl group.

Examples of the divalent alicyclic hydrocarbon group having four to twelve carbon atoms represented by the above Rb and R' include monocyclic cycloalkanediyl groups such as cyclopentanediyl group, cyclohexanediyl group, and cyclooctanediyl group; monocyclic cycloalkenediyl groups such as cyclopentenediyl group, cyclohexenediyl group, and cyclooctenediyl group; polycyclic cycloalkanediyl groups such as norbornanediyl group and adamantanediyl group; and polycyclic cycloalkenediyl groups such as norbornenediyl group and tricyclodecenyl group.

Examples of the divalent aromatic hydrocarbon group having six to twelve carbon atoms represented by the above Rb and R' include phenylene group, tolylene group, and naphthylene group.

The above Rb is preferably a single bond, a divalent chain hydrocarbon group having one to six carbon atoms, a divalent aromatic hydrocarbon group having six to twelve carbon atoms, or —C(=O)—NH—R'— group in which R' is a divalent chain hydrocarbon group having one to six carbon atoms, more preferably a single bond, methanediyl group, phenylene group, or —C(=O)—NH—CH(CH$_3$)—CH$_2$—, still more preferably a single bond or —C(=O)—NH—CH(CH$_3$)—CH$_2$—.

Examples of the above structural unit (1) include structural units represented by the following Formulas (1-1) to (1-4).

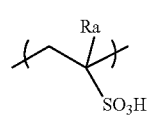

(1-1)

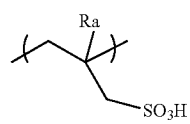

(1-2)

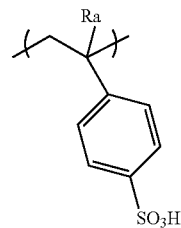

(1-3)

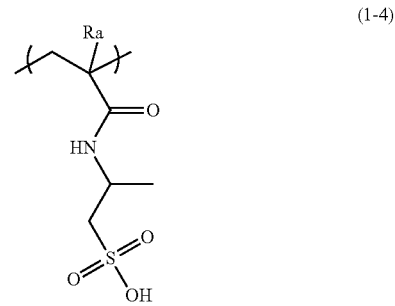

(1-4)

In the above Formulas (1-1) to (1-4), Ra has the same meaning as in the above Formula (1). Among these, the structural unit (1-1) is preferable.

The resin A may contain one kind or two or more kinds of the structural units (1) in combination.

(Carboxyl-Group-Containing Structural Unit)

The resin A preferably contains a carboxyl-group-containing structural unit in addition to the sulfonic-acid-group-containing structural unit described above. When the resin A contains such an acidic group, control of the acidity of the resin A, local distribution of the resin A to the resist film side, removal of the upper layer film by the development liquid, and the like can be improved.

The carboxyl-group-containing structural unit is preferably a structural unit represented by the following Formula (2) (which may hereafter be also referred to as "structural unit (2)").

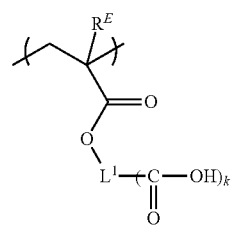

(2)

In the above Formula (2), $R^E$ is a hydrogen atom, a fluorine atom, a methyl group, or a trifluoromethyl group. Here, k is an integer of 0 to 3. When k is 1 to 3, $L^1$ is a (k+1)-valent linking group. When k is 0, $L^1$ is a hydrogen atom.

The above $R^E$ is preferably a hydrogen atom or a methyl group, more preferably a methyl group, in view of copolymerizability of the monomers giving the structural unit (2) and the like.

Examples of the (k+1)-valent linking group represented by the above $L^1$ include an alkanediyl group, a cycloalkanediyl group, an alkenediyl group, and an arenediyl group as the divalent linking groups (when k and m are 1). Here, a part or whole of the hydrogen atoms that these groups have may be substituted with halogen atoms such as a fluorine atom or a chlorine atom, a cyano group, or the like.

Examples of the above alkanediyl group include methanediyl group, ethanediyl group, propanediyl group, butanediyl group, hexanediyl group, and octanediyl group. The above alkanediyl group is preferably an alkanediyl group having one to eight carbon atoms.

Examples of the above cycloalkanediyl group include monocyclic cycloalkanediyl groups such as cyclopentanediyl group and cyclohexanediyl group; and polycyclic cycloalkanediyl groups such as norbornanediyl group and adamantanediyl group. The above cycloalkanediyl group is preferably a cycloalkanediyl group having five to twelve carbon atoms.

Examples of the above alkenediyl group include ethenediyl group, propenediyl group, and butenediyl group. The above alkenediyl group is preferably an alkenediyl group having two to six carbon atoms.

Examples of the above arenediyl group include phenylene group, tolylene group, and naphthylene group. The above arenediyl group is preferably an arenediyl group having six to fifteen carbon atoms.

Among these, $L^1$ is preferably an alkanediyl group or a cycloalkanediyl group, and more preferably is an alkanediyl group having one to four carbon atoms or a cycloalkanediyl group having six to eleven carbon atoms. When $L^1$ is a cycloalkanediyl group, it is preferable in view of enhancing the water repellency of the resist upper layer film formed from the resist upper layer film forming resin composition.

The above k is preferably an integer of 0 to 2, more preferably 0 or 1, and still more preferably 0.

Examples of the above structural unit (2) include structural units represented by the following Formulas (2-1) to (2-3).

In the above Formulas (2-1) to (2-3), $R^E$ has the same meaning as in the above Formula (2). In the above Formulas (2-1) and (2-2), $R^{c1}$ and $R^{c2}$ are each independently a divalent chain hydrocarbon group having one to six carbon atoms, a divalent alicyclic hydrocarbon group having four to twelve carbon atoms, or a divalent aromatic hydrocarbon group having six to twelve carbon atoms.

Examples of the divalent chain hydrocarbon group having one to six carbon atoms represented by the above $R^{c1}$ and $R^{c2}$ include alkanediyl groups such as methanediyl group, ethanediyl group, propanediyl group, butanediyl group, hexanediyl group, and octanediyl group; alkenediyl groups such as ethenediyl group, propenediyl group, and butenediyl group; and alkynediyl groups such as ethynediyl group.

Examples of the divalent alicyclic hydrocarbon group having four to twelve carbon atoms represented by the above $R^{c1}$ and $R^{c2}$ include monocyclic cycloalkanediyl groups such as cyclopentanediyl group and cyclohexanediyl group; polycyclic cycloalkanediyl groups such as norbornanediyl group and adamantanediyl group; monocyclic cycloalkenediyl groups such as cyclopentenediyl group; and polycyclic cycloalkenediyl groups such as norbornenediyl group.

Among these, a saturated chain hydrocarbon group and a monocyclic hydrocarbon group are preferable, and 1,2-ethanediyl group and 1,2-cyclohexanediyl group are more preferable.

Examples of the divalent aromatic hydrocarbon group having six to twelve carbon atoms represented by the above $R^{c1}$ and $R^{c2}$ include groups similar to those exemplified as Rb in the above Formula (1).

Examples of the structural units (2-1) and (2-2) include structural units represented by the following Formulas (2-1-1) to (2-1-5).

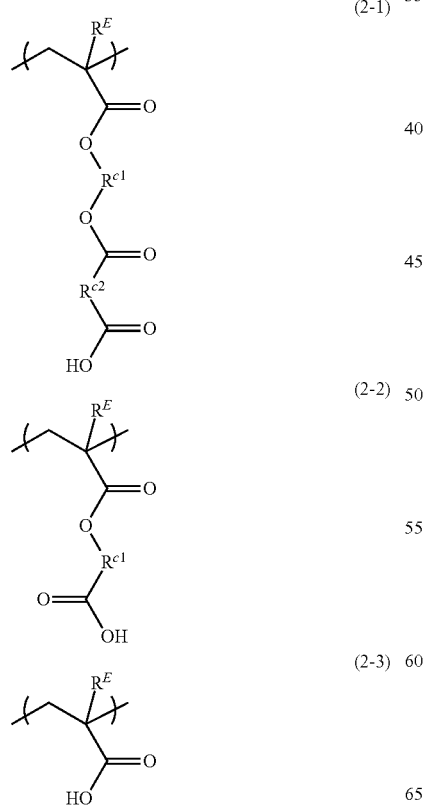

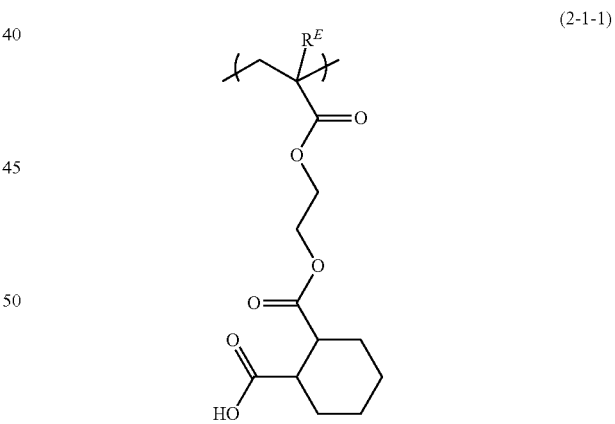

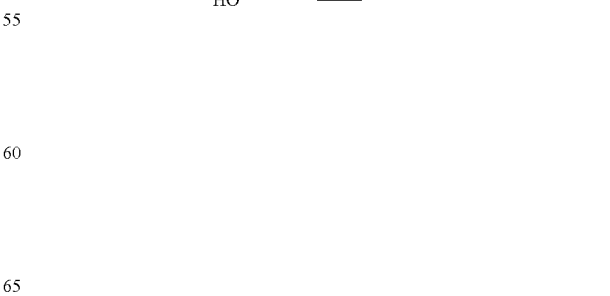

(2-1-2)

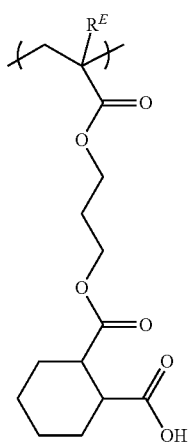

(2-1-3)

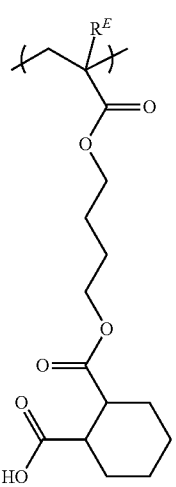

(2-1-4)

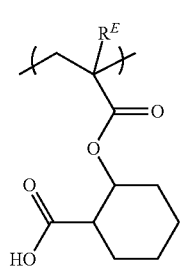

(2-1-5)

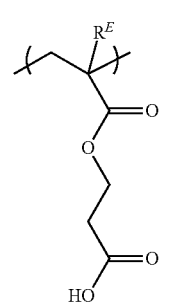

In the above Formulas (2-1-1) to (2-1-5), $R^E$ has the same meaning as in the above Formula (2).

Among the structural units (2-1) to (2-3), the structural unit represented by the above Formula (2-1) and the structural unit represented by the Formula (2-3) are preferable.

Also, among the structural unit represented by the above Formula (2-1), the structural unit represented by the Formula (2-1-1) is preferable.

The resin A may contain one kind or two or more kinds of the structural units (2) in combination.

The content (the sum in the case in which two or more kinds are contained) of the structural unit (2) in the resin A is preferably 5 mol % to 95 mol %, more preferably 10 mol % to 92 mol %, and still more preferably 20 mol % to 90 mol %, relative to the total structural units constituting the resin A. By setting the content of the structural unit (2) in the resin A to be within the aforementioned range, control of the acidity of the resin A, local distribution of the resin A to the resist film side, removal of the upper layer film by the development liquid, and the like can be improved.

(Fluorinated-Hydrocarbon-Group-Containing Structural Unit (I))

The resin A may contain a fluorinated-hydrocarbon-group-containing structural unit (I) besides the structural units (1) and (2). By introducing the fluorinated-hydrocarbon-group-containing structural unit (I) while sufficiently ensuring the acidity of the resin A, the water repellency of the upper layer film formed with use of the upper layer film composition can be suitably controlled.

The fluorinated-hydrocarbon-group-containing structural unit (I) is preferably a structural unit having at least one kind selected from the group consisting of the group represented by the following Formula (3) (fluorinated sulfonamide group) and the group represented by the following Formula (4) (α-trifluoromethyl alcohol group) (hereafter, the structural unit containing the group represented by the following Formula (3) is also referred to as "structural unit (3)", and the structural unit containing the group represented by the following Formula (4) is also referred to as "structural unit (4)".

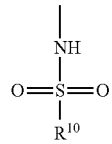

(3)

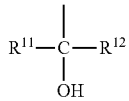

(4)

In the above Formula (3), $R^{10}$ is a monovalent fluorinated hydrocarbon group having one to twenty carbon atoms. In the above Formula (4), $R_{11}$ is a monovalent fluorinated hydrocarbon group having one to twenty carbon atoms, and $R^{12}$ is a hydrogen atom or a monovalent organic group having one to twenty carbon atoms.

Examples of the monovalent fluorinated hydrocarbon group having one to twenty carbon atoms represented by the above $R^{10}$ and $R^{11}$ include groups in which a part or whole of the hydrogen atoms that the saturated or unsaturated chain hydrocarbon groups, monocyclic or polycyclic alicyclic hydrocarbon groups, aryl groups, or aralkyl groups have are substituted with fluorine atoms. Examples of the polycyclic structure include cross-linked polycyclic structures such as a norbornane structure, an adamantane structure, and a tricyclodecane structure in addition to the condensed-ring structure.

Examples of the monovalent organic group represented by the above $R^{12}$ include a monovalent hydrocarbon group having one to twenty carbon atoms, a monovalent heteroatom-containing group containing a group having a heteroatom between carbon-carbon of this hydrocarbon group, and a monovalent group in which a part or whole of the hydrogen atoms that the above hydrocarbon group or the heteroatom-containing group has are substituted with a substituent.

Examples of the above monovalent hydrocarbon group include chain hydrocarbon groups such as alkyl groups such as methyl group, ethyl group, propyl group, and butyl group; alkenyl groups such as ethenyl group, propenyl group, and butenyl group; and alkynyl groups such as ethynyl group, propynyl group, and butynyl group; alicyclic hydrocarbon groups such as cycloalkyl groups such as cyclopentyl group, cyclohexyl group, norbornyl group, and adamantyl group; and cycloalkenyl groups such as cyclopentenyl group and norbornenyl group; and aromatic hydrocarbon groups such as aryl groups such as phenyl group, tolyl group, xylyl group, naphthyl group, and anthryl group; and aralkyl groups such as benzyl group, phenethyl group, and naphthylmethyl group.

The heteroatom in the aforementioned group having a heteroatom is not particularly limited as long as the heteroatom is an atom other than a carbon atom or a hydrogen atom, and examples thereof include an oxygen atom, a nitrogen atom, a silicon atom, a phosphorus atom, and a sulfur atom. Examples of the above group having a heteroatom include —CO—, —COO—, —O—, —NR″—, —CS—, —S—, —SO—, —SO$_2$—, and groups obtained by combining these.

Examples of the above substituent include halogen atoms such as a fluorine atom, a chlorine atom, a bromine atom, and an iodine atom, hydroxyl group, carboxyl group, cyano group, nitro group, alkoxyl group, alkoxycarbonyl group, acyl group, and acyloxy group.

$R^{12}$ is preferably a group having a hydrogen atom, a monovalent hydrocarbon group, a monovalent fluorinated hydrocarbon group, or a hydroxyl group, more preferably a group having a hydrogen atom, an alkyl group, a fluorinated alkyl group, a hydroxyl group, or a fluorine atom, still more preferably a group containing a hydrogen atom, an alkyl group having one to six carbon atoms, a fluorinated alkyl group having one to six carbon atoms, or a di (trifluoromethyl) hydroxymethyl group having one to six carbon atoms, and particularly preferably a hydrogen atom, methyl group, ethyl group, 1,1,1-trifluoromethyl group, 2,2,2-trifluoroethyl group, or 2-hydroxy-2-trifluoromethyl-1,1,1-trifluoro-4-butyl group.

Examples of the above structural unit (3) include structural units represented by the following Formula (3-1) (which may hereafter be also referred to as "structural unit (3-1)")

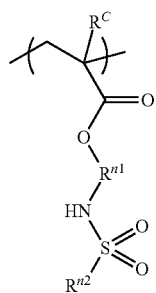

(3-1)

In the above Formula (3-1), $R^C$ is a hydrogen atom, a methyl group, a fluorine atom, or a trifluoromethyl group. $R^{n1}$ is a divalent linking group. $R^{n2}$ is a fluorinated alkyl group having one to twenty carbon atoms.

The above $R^C$ is preferably a hydrogen atom or a methyl group, more preferably a methyl group, in view of copolymerizability of the monomers giving the structural unit (3-1) and the like.

Examples of the above divalent linking group represented by $R^{n1}$ include a divalent chain hydrocarbon group having one to six carbon atoms, a divalent alicyclic hydrocarbon group having four to twelve carbon atoms, and a group containing —O—, —CO—, or —COO— between carbon-carbon of these groups.

Examples of the above divalent chain hydrocarbon group having one to six carbon atoms include a group in which two of the hydrogen atoms contained in saturated or unsaturated chain hydrocarbon groups have been removed.

Examples of the above divalent alicyclic hydrocarbon group having four to twelve carbon atoms include a group in which two of the hydrogen atoms contained in monocyclic or polycyclic alicyclic hydrocarbon groups have been removed.

Among these, $R^{n1}$ is preferably a divalent chain hydrocarbon group having one to three carbon atoms, more preferably an alkanediyl group having one to three carbon atoms, and more preferably 1,2-ethanediyl group.

Examples of the above fluorinated alkyl group having one to twenty carbon atoms represented by $R^{n2}$ include fluoromethyl group, difluoromethyl group, trifluoromethyl group, trifluoroethyl group, pentafluoromethyl group, heptafluoropropyl group, and nonafluorobutyl group. Among these, trifluoromethyl group is preferable.

Examples of the above structural unit (4) include structural unit represented by the following Formula (4-1) (which may hereafter be also referred to as "structural unit (4-1)").

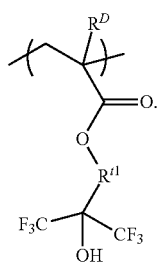

(4-1)

In the above Formula (4-1), $R^D$ is a hydrogen atom, a fluorine atom, a methyl group, or a trifluoromethyl group. $R^{t1}$ is a divalent linking group.

The above $R^D$ is preferably a hydrogen atom or a methyl group, more preferably a methyl group, in view of copolymerizability of the monomers giving the structural unit (4-1) and the like.

The above divalent linking group represented by $R^{t1}$ include groups similar to those exemplified as $R^{n1}$ in the above Formula (3-1). Among these, $R^{t1}$ is preferably a divalent chain hydrocarbon group having one to three carbon atoms or a divalent alicyclic hydrocarbon group having four to twelve carbon atoms, more preferably a divalent group containing a propanediyl group or a cyclohexane skeleton, a divalent group containing a norbornane skeleton, a divalent group containing a tetracyclododecane skeleton, or a divalent group containing an adamantane skeleton, more preferably 1,2-propanediyl group or 1-cyclohexyl-1,2-ethanediyl group.

Examples of the structural unit (4-1) include structural units represented by the following Formulas (4-1-1) to (4-1-8).

(4-1-1)
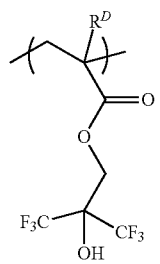

(4-1-2)
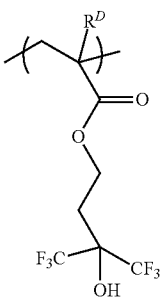

(4-1-3)
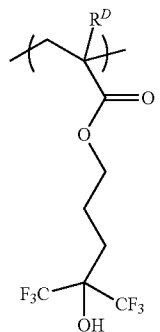

(4-1-4)
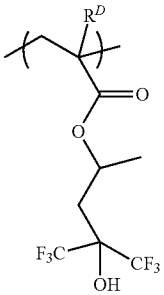

(4-1-5)
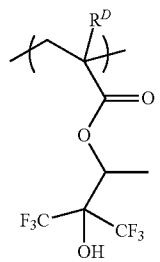

(4-1-6)
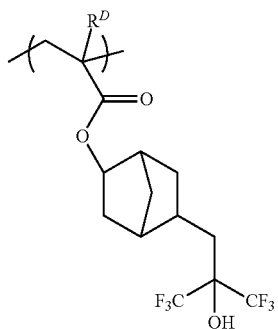

(4-1-7)
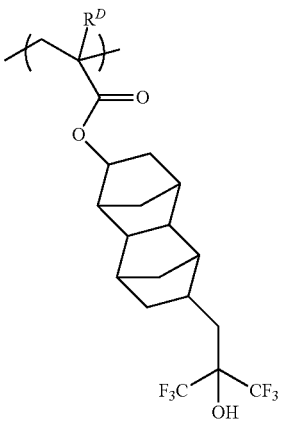

(4-1-8)
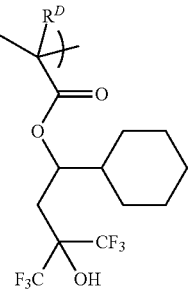

In the above Formulas (4-1-1) to (4-1-8), $R^D$ has the same meaning as in the above Formula (4-1).

Among these, the structural unit represented by the above Formula (4-1-4) and the structural unit represented by the Formula (4-1-8) are preferable.

The resin A may contain one kind or two or more kinds of the fluorinated-hydrocarbon-group-containing structural units (I) in combination.

The content of the fluorinated-hydrocarbon-group-containing structural unit (I) in the resin A is preferably 0 mol % to 50 mol %, more preferably 5 mol % to 40 mol %, still more preferably 10 mol % to 30 mol %, and particularly preferably 15 mol % to 25 mol %, relative to the total structural units constituting the resin A. By setting the content of the fluorinated-hydrocarbon-group-containing structural unit (I) in the resin A to be within the aforementioned range, the balance between the water repellency of the upper layer film formed from the upper layer film composition and the removal of the upper layer film can be further improved.

(Other Structural Units)

The resin A may have other structural units besides the above structural units (1) to (4). Examples of the above other structural units include structural units derived from alkyl (meth)acrylates such as methyl (meth)acrylate, ethyl (meth) acrylate, propyl (meth)acrylate, butyl (meth)acrylate, and lauryl (meth)acrylate, in view of improving the water repellency. Also, the examples include structural units having an acid-dissociative group in view of controlling the molecular weight, glass transition point, solubility to the solvent, and the like of the resin A. In the present specification, the "acid-dissociative group" refers to a group that substitutes for a hydrogen atom owned by a carboxyl group has and that is dissociated by action of an acid.

It is possible to adopt a configuration such that the resin A does not contain the aforementioned other structural units. Also, when the resin A contains the aforementioned other structural units, the content of the aforementioned other structural units in the resin A is preferably 10 mol or more, more preferably 20 mol % or more, and still more preferably 30 mol % or more, relative to the total structural units constituting the resin A. On the other hand, the aforementioned content is preferably 90 mol % or less, more preferably 80 mol % or less, and still more preferably 70 mol % or less.

(Content of Fluorine Atom in Resin A)

It is possible to adopt a configuration such that the resin A does not contain a fluorine atom. This can promote the local distribution of the resin A in a neighborhood of the resist film surface and the local distribution of the resin C in a neighborhood of the upper layer film surface, and can further enhance the water repellency of the upper layer film and the development liquid solubility of the resist film. Alternatively, the resin A may contain a fluorine atom. When the resin A contains a fluorine atom, the amount of the fluorine atom contained in the resin A with respect to a total mass of the resin A is preferably 30 mass % or less, more preferably 1 mass % or more and 25 mass % or less, and still more preferably 5 mass % or more and 20 mass or less. The water repellency of the resin A can be controlled by the content of the fluorine atoms in the resin A.

In the upper layer film composition, the content of the resin A is smaller than the content of the resin C (which will be described later). In the upper layer film composition, it is preferable that the content of the resin A in a total mass of resin solid components of the upper layer film composition be 0.1 mass % or more and less than 5 mass %, more preferably 0.3 mass % or more and less than 4.8 mass %, and still more preferably 0.5 mass % or more and less than 4.5 mass %. By setting the content of the highly acidic resin A to be within the aforementioned range, residue defect preventability and water mark defect preventability can be made compatible with each other at a high level.

(Resin C)

The resin C is a resin containing a fluorine atom in a larger content per unit mass than the content of a fluorine atom per unit mass in the resin A. It is sufficient that the content of the fluorine atom satisfies this relationship; however, the amount of the fluorine atom contained in the resin C with respect to a total mass of the resin C preferably exceeds 40 mass %, and more preferably is 42 mass % or more, still more preferably 44 mass % or more, and particularly preferably 45 mass % or more. The amount of the fluorine atom contained in the resin C with respect to a total mass of the resin C is preferably 60 mass % or less, more preferably 55 mass % or less, and still more preferably 53 mass % or less, in view of the solubility of the upper layer film formed by the upper layer film composition to the development liquid, the facility of synthesizing the resin C, and the like.

The resin C preferably contains the aforementioned fluorinated-hydrocarbon-group-containing structural unit (I). Compatibility between the water repellency of the upper layer film formed by using the upper layer film composition and the development liquid solubility of the resist film can be further enhanced.

The content of the fluorinated-hydrocarbon-group-containing structural unit (I) in the resin C is preferably 10 mol % to 100 mol %, more preferably 20 mol % to 90 mol %, still more preferably 30 mol % to 70 mol %, and particularly preferably 35 mol % to 60 mol %, relative to the total structural units constituting the resin C. By setting the content of the fluorinated-hydrocarbon-group-containing structural unit (I) in the resin C to be within the aforementioned range, the balance between the water repellency of the upper layer film formed from the upper layer film composition and the removal of the upper layer film can be further improved.

(Fluorinated-Hydrocarbon-Group-Containing Structural Unit (II))

The resin C may contain a fluorinated-hydrocarbon-group-containing structural unit (II) that is different from the aforementioned fluorinated-hydrocarbon-group-containing structural unit (I). This can improve the water repellency of the upper layer film formed by using the upper layer film composition.

Although not particularly limited, the fluorinated hydrocarbon group may be, for example, a fluorinated alkyl group or a fluorinated cycloalkyl group.

The fluorinated alkyl group may be, for example, a group in which a part or whole of the hydrogen atoms that the straight-chain or branched alkyl groups have are substituted with a fluorine atom.

The fluorinated cycloalkyl group may be, for example, a group in which a part or whole of the hydrogen atoms that the monocyclic or polycyclic cycloalkyl groups have are substituted with a fluorine atom.

The fluorinated-hydrocarbon-group-containing structural unit (II) is preferably a structural unit represented by the following Formula (5).

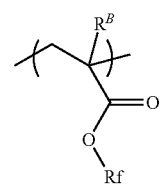

(5)

In the above Formula (5), $R^B$ is a hydrogen atom, a methyl group, a fluorine atom, or a trifluoromethyl group. Rf is a fluorinated alkyl group or a fluorinated cycloalkyl group.

The above $R^B$ is preferably a hydrogen atom or a methyl group, more preferably a methyl group, in view of the copolymerizability of the monomers giving the structural unit (5) and the like.

The above Rf is preferably a fluorinated alkyl group, more preferably a fluorinated alkyl group having one to four carbon atoms, still more preferably a fluorinated alkyl group having two or three carbon atoms, and particularly preferably 2,2,2-trifluoroethyl group or 1,1,1,3,3,3-hexafluoro-2-propyl group.

Examples of the structural unit (5) include structural units represented by the following Formulas (5-1) to (5-6).

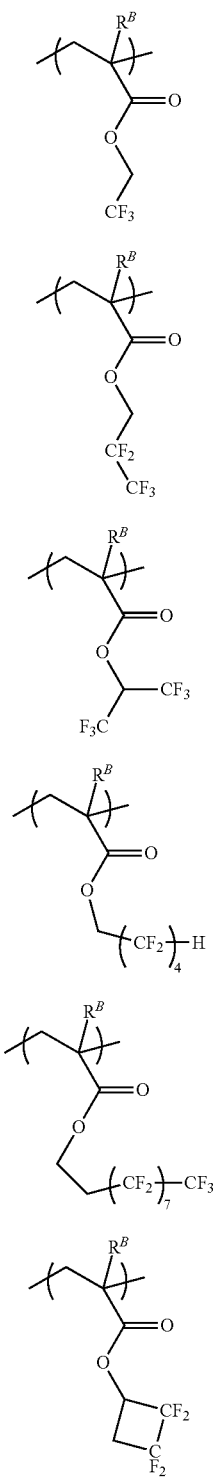

(5-1)
(5-2)
(5-3)
(5-4)
(5-5)
(5-6)

In the above Formulas (5-1) to (5-6), $R^B$ has the same meaning as in the above Formula (5).

Among these, the structural unit represented by the above Formula (5-1) and the structural unit represented by the Formula (5-3) are preferable.

It is sufficient that the content of the fluorinated-hydrocarbon-group-containing structural unit (II) in the resin C is selected so that the aforementioned amount of the fluorine atom contained per unit mass may be obtained. The content of the fluorinated-hydrocarbon-group-containing structural unit (II) in the resin C is preferably 20 mol % to 80 mol %, more preferably 25 mol % to 75 mol %, and still more preferably 30 mol % to 70 mol %, relative to the total structural units constituting the resin C. By setting the content of the fluorinated-hydrocarbon-group-containing structural unit (II) in the resin C to be within the aforementioned range, sufficient water repellency can be imparted to the resist upper layer film formed from the upper layer film composition.

(Other Structural Units)

The resin C may contain the structural units (1) to (2) and other structural units that can be used in the resin A besides the aforementioned fluorinated-hydrocarbon-group-containing structural units (I) and (II) unless the water repellency of the resin C is degraded. However, it is preferable that the resin C do not contain a sulfonic-acid-group-containing structural unit. By not introducing the sulfonic acid group which is a strong acid, decrease in the water repellency of the upper layer film can be suppressed, and the water mark defects can be more efficiently prevented.

In the upper layer film composition, it is preferable that the content of the resin C in a total mass of resin solid components of the upper layer film composition be 10 to 98 mass %, more preferably 15 to 95 mass %, and still more preferably 20 to 90 mass %. By setting the content of the highly water-repellent resin C to be within the aforementioned range, the receding contact angle of water of the upper layer film can be enhanced, and the water mark defect preventability can be further improved.

(Resin B)

The resist upper layer film forming composition according to the present embodiment preferably further includes a resin B that contains a sulfonic-acid-group-containing structural unit in an amount exceeding 0 mol % and being 5 mol % or less with respect to total structural units included in the resin B and has a content of a fluorine atom per unit mass smaller than the content of a fluorine atom per unit mass in the resin C. By incorporating the lowly acidic and lowly water-repellent resin B, the development liquid solubility derived from the highly acidic resin A and the water repellency derived from the highly water-repellent resin C can be exhibited with a better balance.

(Sulfonic-Acid-Group-Containing Structural Unit)

The structural unit (1) contained in the resin A can be suitably used as the sulfonic-acid-group-containing structural unit contained in the resin B. It is sufficient that the content of the sulfonic-acid-group-containing structural unit in the resin B is within a range exceeding 0 mol % and being 5 mol % or less relative to the total structural units constituting the resin B. The content is preferably 4.8 mol % or less, more preferably 4.5 mol % or less, and still more preferably 4.2 mol % or less. On the other hand, the content is preferably 0.5 mol % or more, more preferably 1 mol % or more, and still more preferably 1.5 mol % or more.

(Other Structural Units)

The resin B may contain the structural units (2) to (4) and other structural units that can be used in the resin A besides the aforementioned sulfonic-acid-group-containing structural unit.

When the resin B contains the structural unit (2), the content of the structural unit (2) is preferably 20 mol % to 98 mol %, more preferably 30 mol % to 96 mol %, and still more preferably 40 mol % to 90 mol %, relative to the total structural units constituting the resin B.

When the resin B contains the fluorinated-hydrocarbon-group-containing structural unit (I), the content of the fluorinated-hydrocarbon-group-containing structural unit (I) (structural units (3) and (4)) is selected within a range such that the amount of the fluorine atom contained per unit mass is smaller than in the resin C. The content of the fluorinated-hydrocarbon-group-containing structural unit (I) may occupy the whole of the rest parts excluding the sulfonic-acid-group-containing units, and is preferably 50 mol % to 99 mol %, more preferably 60 mol % to 98 mol %.

When the upper layer film composition contains the resin B, the content of the resin B in the total mass of resin solid components of the upper layer film composition is preferably 10 to 90 mass %, more preferably 10 to 85 mass %, and still more preferably 15 to 80 mass %. By setting the content of the resin B to be within the aforementioned range, each of the functions of the resin A and the resin B can be sufficiently exhibited, and the water repellency of the upper layer film and the solubility to the development liquid can be optimized.

(Method of Synthesizing Each Resin)

The aforementioned resin A can be synthesized, for example, by subjecting a predetermined monomer to polymerization such as radical polymerization in a polymerization solvent in the presence of a suitably selected polymerization initiator or chain-transfer agent.

Examples of the aforementioned polymerization solvent include alcohol-based solvents, ether-based solvents, ketone-based solvents, ester-based solvents, and hydrocarbon-based solvents.

Examples of the alcohol-based solvents include aliphatic monoalcohols having one to eighteen carbon atoms such as 4-methyl-2-pentanol and n-hexanol; alicyclic monoalcohols having three to eighteen carbon atoms such as cyclohexanol; polyhydric alcohols having two to eighteen carbon atoms such as 1,2-propylene glycol; and polyhydric alcohol partial ethers having three to nineteen carbon atoms such as propylene glycol monomethyl ether.

Examples of the ether-based solvents include dialkyl ethers having two to fourteen carbon atoms such as diethyl ether and dipropyl ether; cyclic ethers such as tetrahydrofuran and tetrahydropyran; and aromatic-ring-containing ethers such as diphenyl ether and anisole.

Examples of the ketone-based solvents include chain ketones having three to twelve carbon atoms such as acetone, methyl ethyl ketone, and methyl-n-butyl ketone; cyclic ketones having five to eight carbon atoms such as cyclopentanone and cyclohexanone; 2,4-pentanedione, acetonylacetone, and acetophenone.

Examples of the ester-based solvents include monocarboxylic acid esters such as n-butyl acetate and ethyl lactate; polyhydric alcohol carboxylates such as propylene glycol acetate; polyhydric alcohol partial ether carboxylates such as propylene glycol monomethyl ether acetate; polycarboxylic acid diesters such as diethyl oxalate; and carbonates such as dimethyl carbonate and diethyl carbonate.

Examples of the hydrocarbon-based solvents include aliphatic hydrocarbons having five to twelve carbon atoms such as n-pentane and n-hexane; and aromatic hydrocarbons having six to sixteen carbon atoms such as toluene and xylene.

Among these, alcohol-based solvents, ether-based solvents, ketone-based solvents, or ester-based solvents are preferable, and aliphatic monoalcohols, cyclic ethers, and chain or cyclic ketones are more preferable. One kind or two or more kinds of the aforementioned polymerization solvents can be used.

The weight-average molecular weight (Mw), as converted in terms of polystyrene, of the resin A by gel permeation chromatography (GPC) is preferably 2,000 to 50,000, more preferably 3,000 to 30,000, still more preferably 5,000 to 20,000, and particularly preferably 6,000 to 13,000. By setting the Mw of the resin A to be above or equal to the aforementioned lower limit, moisture resistance and mechanical properties as the upper layer film can be improved. By setting the Mw of the resin A to be below or equal to the aforementioned upper limit, the solubility of the resin A to the solvent can be enhanced.

The ratio (Mw/Mn) of the Mw of the resin A to the number-average molecular weight (Mn), as converted in terms of polystyrene, of the resin A by GPC is preferably 1 to 5, more preferably 1 to 3, and still more preferably 1 to 2.5.

The amount of impurities, such as halogen ions and metals, contained in the upper layer film composition is preferably as little as possible. By reducing the amount of the impurities, the application property as the upper layer film and the uniform solubility to the alkali development liquid can be improved. As a method for purifying the resin A in order to reduce the amount of the impurities, for example, washing, extraction, adsorption, filtration, centrifugal separation, and the like may be carried out either singly or in combination of these.

(Solvent)

The resist upper layer film forming resin composition according to the present embodiment contains a solvent. Any solvent can be used as long as the solvent can dissolve or disperse each resin component and the additives that are added in accordance with the needs. Among these, it is possible to suitably use a solvent that invites little decrease in the lithography performance caused by generation of excessive intermixing with the resist film upon applying the upper layer film composition onto the resist film.

Examples of the solvent include alcohol-based solvents, ether-based solvents, hydrocarbon-based solvents, ketone-based solvents, ester-based solvents, and water.

Examples of the alcohol-based solvents include monohydric alcohols such as butanol and pentanol; polyhydric alcohols such as ethylene glycol and propylene glycol; and partial alkyl ethers of polyhydric alcohol such as ethylene glycol monomethyl ether and ethylene glycol monoethyl ether.

Examples of the ether-based solvents include alkyl ethers of polyhydric alcohol such as ethylene glycol dimethyl ether, ethylene glycol methyl ethyl ether, ethylene glycol diethyl ether, and diethylene glycol dimethyl ether; aliphatic ethers such as diethyl ether, dipropyl ether, dibutyl ether, butyl methyl ether, butyl ethyl ether, diisoamyl ether, hexyl methyl ether, octyl methyl ether, cyclopentyl methyl ether, and dicyclopentyl ether; aliphatic-aromatic ethers such as anisole and phenyl ethyl ether; and cyclic ethers such as tetrahydrofuran, tetrahydropyran, and dioxane.

Examples of the hydrocarbon-based solvents include lower hydrocarbons such as hexane, cyclohexane, and heptane; and higher hydrocarbons such as decane, dodecene, and undecane.

Examples of the ketone-based solvents include dialkyl ketones such as acetone and methyl ethyl ketone; and cyclic ketones such as cyclopentanone and cyclohexanone.

Examples of the ester-based solvents include alkyl ether acetates of polyhydric alcohol such as ethylene glycol monomethyl ether acetate, ethylene glycol monoethyl ether acetate, diethylene glycol monomethyl ether acetate, and diethylene glycol monoethyl ether acetate; and aliphatic acid esters such as ethyl acetate and butyl acetate.

Among these, alcohol-based solvents, ether-based solvents, and ester-based solvents are preferable. As the alcohol-based solvents, monohydric alcohols and partial alkyl ethers of polyhydric alcohol are preferable. As the ether-based solvents, aliphatic ethers, cyclic ethers, and alkyl ethers of polyhydric alcohol are preferable. As the ester-based solvents, alkyl ether acetates of polyhydric alcohol are preferable. Among these, monohydric alcohols having four to ten carbon atoms and aliphatic ethers having an alkyl chain and having four to ten carbon atoms are more preferable, and 4-methyl-2-pentanol and diisoamyl ether are particularly preferable. When the solvent contains an ether-based solvent, the resist upper layer film forming resin composition can have a reduced viscosity, and the application amount thereof can be effectively reduced. As a result of this, the costs can be advantageously reduced.

(Additives)

In addition to each resin component and the solvent, the resist upper layer film forming resin composition may contain additives. Examples of the additives include surfactants.

Examples of the surfactants include commercially available fluorine-based surfactants such as BM-1000 and BM-1100 (these two are manufactured by BM Chemie), and MEGAFAC F142D, MEGAFAC F172, MEGAFAC F173, and MEGAFAC F183 (these four are manufactured by DIC Corporation). The content of the aforementioned surfactants is preferably 5 parts by mass or less relative to 100 parts by mass of the resin components.

(Receding Contact Angle of Resist Upper Layer Film)

The receding contact angle of an upper layer film formed from the upper layer film composition, with respect to water, is desirably 75° or more in view of the throughput at the time of liquid immersion exposure and the yield, preferably 80° or more, more preferably 81° or more, and still more preferably 82° or more. When the upper layer film has a receding contact angle within the aforementioned range, the water repellency of the upper layer film is further enhanced, and the water mark defects can be more efficiently prevented.

<Method of Preparing Resist Upper Layer Film Forming Composition>

The resist upper layer film forming resin composition can be prepared, for example, by mixing and dissolving each resin component and optional additives added in accordance with the needs with a solvent. The solid component concentration of the resist upper layer film forming resin composition is typically 0.5 mass % to 30 mass %, preferably 1 mass % to 20 mass %.

<Method of Forming Resist Pattern>

A method of forming a resist pattern according to the present embodiment includes:

(1) applying a photoresist composition on a substrate to form a resist film on the substrate;

(2) applying the liquid immersion upper layer film forming resin composition on the resist film to form a liquid immersion upper layer film on the resist film;

(3) performing liquid immersion exposure on the resist film on which the liquid immersion upper layer film is formed; and (4) developing the resist film after the liquid immersion exposure.

According to the resist pattern forming method, since the resist upper layer film forming resin composition is used, a resist upper layer film (in particular, a liquid immersion upper layer film) being excellent in development liquid solubility while exhibiting a high water repellency can be formed.

Hereinafter, each step will be described.

(Step (1))

In the step (1), a photoresist composition is applied onto a substrate so as to form a resist film. As the substrate, typically, a silicon wafer, a silicon wafer covered with aluminum, or the like is used. Also, in order to draw out the characteristics of the resist film to the maximum extent, it is also preferable to form an organic or inorganic reflection preventive film, which is disclosed, for example, in JP-B-06-12452, on a surface of the substrate in advance.

The type of the photoresist composition is not particularly limited, and a suitable one may be selected and used from among the photoresist compositions that are conventionally used for forming a resist film, in accordance with the purpose of use of the resist. Among these, a photoresist composition containing a resin P having an acid-dissociative group and an acid generating agent Q is preferable.

In the resin P, a structural unit having an acid-dissociative group (hereinafter also referred to as "structural unit (p)") may be, for example, a structural unit represented by the following Formula (6).

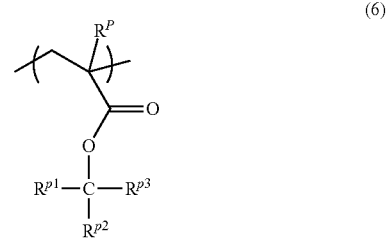

(6)

In the Formula (6), $R^P$ is a hydrogen atom, a fluorine atom, a methyl group, or a trifluoromethyl group. $R^{p1}$ is a monovalent chain hydrocarbon group having one to ten carbon atoms. $R^{p2}$ and $R^{p3}$ each represent a monovalent chain hydrocarbon group having one to ten carbon atoms, a monovalent alicyclic hydrocarbon group having three to twenty carbon atoms, or a ring structure formed by bonding of these groups with each other and having three to twenty carbon atoms.

The above $R^P$ is preferably a hydrogen atom or a methyl group, more preferably a methyl group, in view of copolymerizability of the monomers giving the structural units (p) and the like.

Examples of the monovalent chain hydrocarbon group having one to ten carbon atoms represented by the above $R^{p1}$, $R^{p2}$, and $R^{p3}$ include alkyl groups such as methyl group, ethyl group, n-propyl group, i-butyl group, and n-butyl group.

Examples of the monovalent alicyclic hydrocarbon group having three to twenty carbon atoms represented by the above $R^{p2}$ and $R^{p3}$ include monocyclic cycloalkyl groups such as cyclobutyl group, cyclopentyl group, and cyclohexyl group; and polycyclic cycloalkyl groups such as norbornyl group and adamantyl group.

Examples of the above ring structure formed by bonding of these groups with each other and having three to twenty carbon atoms include monocyclic cycloalkane structures such as a cyclopentane structure and a cyclohexane structure; and polycyclic cycloalkane structures such as a norbornane structure and an adamantane structure.

Examples of the structural unit (p) include structural units derived from 1-alkyl-1-monocyclic cycloalkyl (meth) acrylates such as 1-ethyl-1-cyclopentyl (meth) acrylate; and 2-alkyl-2-polycyclic cycloalkyl (meth)acrylates such as 2-i-propyl-2-adamantyl (meth)acrylate.

Besides the structural unit (p), the resin P preferably further has a structural unit (which may hereafter be also referred to as "structural unit (q)") containing at least one kind selected from the group consisting of a lactone structure, a cyclic carbonate structure, and a sultone structure.

Examples of the structural unit (q) include structural units derived from (meth)acrylic acid esters including a norbornane lactone structure, a butyrolactone structure, and others as the lactone structure; an ethylene carbonate structure, a propylene carbonate structure, and others as the cyclic carbonate structure; and a norbornane sultone structure and a propane sultone structure as the sultone structure.

Also, the resin P may contain other structural units other than the structural unit (p) and the structural unit (q). Examples of the other structural units include a structural unit containing a hydrocarbon group having four or more and twenty or less carbon atoms and a structural unit containing a polar group such as a hydroxyl group.

The content of the structural unit (p) is preferably 30 mol % to 60 mol % relative to the total structural units constituting the resin P. By setting the content of structural unit (p) to be within the aforementioned range, the resolution of the photoresist composition can be improved. When the content of structural unit (p) is less than the above lower limit, the pattern formability of the photoresist composition may deteriorate. When the content of structural unit (p) exceeds the above upper limit, the adhesion of the formed resist film to the substrate may decrease.

The content of the structural unit (q) is preferably 20 mol % to 60 mol % relative to the total structural units constituting the resin P. By setting the content of structural unit (q) to be within the aforementioned range, the solubility of the resist film formed from the photoresist composition to the development liquid can be suitably adjusted, and the adhesion of the resist film to the substrate can be improved. When the content of structural unit (q) is less than the above lower limit, the adhesion of the photoresist composition to the substrate may decrease. When the content of structural unit (q) exceeds the above upper limit, the pattern formability of the photoresist composition may deteriorate.

The content of the aforementioned other structural units is preferably 20 mol % or less, more preferably 15 mol % or less, relative to the total structural units constituting the resin P.

The aforementioned acid generating agent Q is a substance that generates an acid by radiation (exposure). By action of this generated acid, the acid-dissociative group that has protected the carboxyl group and the like of the resin P is dissociated at the exposed part, thereby generating a carboxyl group and the like. As a result of this, the solubility of the resin P to the development liquid changes at the exposed part, whereby the resist pattern is formed.

Examples of the acid generating agent Q include onium salts such as sulfonium salt, tetrahydrothiophenium salt, iodonium salt, phosphonium salt, diazonium salt, and pyridinium salt, N-sulfonyloxyimide compounds, halogen-containing compounds, and diazoketone compounds.

Examples of the sulfonium salt include triphenylsulfonium nonafluoro-n-butanesulfonate, 4-cyclohexylphenyldiphenylsulfonium nonafluoro-n-butanesulfonate, triphenylsulfonium 2-(bicyclo[2.2.1]hepta-2'-yl)-1,1,2,2-tetrafluoroethanesulfonate, and triphenylsulfonium 2-(bicyclo[2.2.1]hepta-2'-yl)-1,1-difluoroethanesulfonate.

Examples of the tetrahydrothiophenium salt include 1-(4-n-butoxynaphthalene-1-yl)tetrahydrothiophenium nonafluoro-n-butanesulfonate and 1-(4-n-butoxynaphthyl)tetrahydrothiophenium 2-(bicyclo[2.2.1]hepta-2'-yl)-1,1,2,2-tetrafluoroethanesulfonate.

The photoresist composition may contain other components such as an acid diffusion controlling agent R, a resin S containing a fluorine atom in a larger amount per unit mass than in the resin P (fluorine-atom-containing polymer), and a surfactant besides the resin P and the acid generating agent Q. Examples of the acid diffusion controlling agent R include amine compounds such as trioctylamine and triethanolamine; N-t-alkoxycarbonyl-containing amide compounds such as R-(+)-(t-butoxycarbonyl)-2-piperidinemethanol and N-t-butoxycarbonyl-4-hydroxypiperidine; and photodegradable bases such as triphenylsulfonium 10-camphorsulfonate and triphenylsulfonium salicylate.

The resin S which is a fluorine-atom-containing polymer is a resin containing a fluorine atom in a larger content per unit mass than the content of a fluorine atom per unit mass in the resin P. The resin S contains a fluorine atom in a larger content per unit mass than the content of a fluorine atom per unit mass in the resin P, so that, owing to the oil-repellent characteristic thereof, the fluorine-atom-containing polymer is liable to be locally distributed in the resist film surface layer when the resist film is formed. As a result of this, the components in the resist film can be prevented from migrating into the upper layer film. Also, use of a resin having a later-described alkali-dissociative group as the resin S can enhance the solubility to the development liquid and can contribute to the suppression of the residue defects.

A lower limit of the amount of fluorine atoms contained per unit mass in the resin S is preferably 1 mass %, more preferably 2 mass %, and still more preferably 3 mass %. An upper limit of the amount of fluorine atoms contained per unit mass in the resin S is preferably 60 mass %, more preferably 50 mass %, and still more preferably 40 mass %. By setting the amount of fluorine atoms contained per unit mass in the resin S to be within the aforementioned range, the local distribution of the resin S in the resist film can be adjusted more suitably. Here, the amount of fluorine atoms contained per unit mass in the resin can be determined by determining the structure of the resin through $^{13}$C-NMR spectrum measurement and making calculations from the structure.

The form by which the fluorine atoms are contained in the resin S is not particularly limited, so that the fluorine atoms may be bonded to any of the main chain, side chain, and terminal end; however, the resin S preferably has a structural unit containing a fluorine atom (which may hereafter be also referred to as "structural unit (f)"). Besides the structural unit (f), the resin S preferably has a structural unit containing an acid-dissociative group in view of improving suppression of the development defects of the photoresist composition. The structural unit containing an acid-dissociative group may be, for example, the structural unit (p) in the resin P.

Also, the resin S preferably has an alkali-dissociative group. When the resin S has an alkali-dissociative group, the resist film surface can be effectively turned from being hydrophobic to being hydrophilic when alkali development is carried out, thereby further improving suppression of the development defects of the photoresist composition. The "alkali-dissociative group" is a group that substitutes for a hydrogen atom of a carboxyl group, a hydroxyl group, or the like and that is dissociated in an aqueous alkali solution (for example, aqueous solution of 2.38 mass % tetramethylammonium hydroxide of 23° C.).

The structural unit (f) is preferably a structural unit represented by the following Formula (f-1) (which may hereafter also be referred to as "structural unit (f-1)") or a structural unit represented by the following Formula (f-2) (which may hereafter also be referred to as "structural unit (f-2)"). The structural unit (f) may have one kind or two or more kinds of each of the structural unit (f-1) and the structural unit (f-2).

[Structural Unit (f-1)]

The structural unit (f-1) is a structural unit represented by the following Formula (f-1). When the resin S contains the structural unit (f-1), the amount of fluorine atoms contained per unit mass can be adjusted.

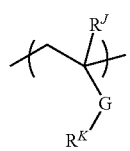

(f-1)

In the above Formula (f-1), $R^J$ is a hydrogen atom, a fluorine atom, a methyl group, or a trifluoromethyl group. G is a single bond, an oxygen atom, a sulfur atom, —COO—, —SO$_2$NH—, —CONH—, or —OCONH—. $R^K$ is a monovalent fluorinated chain hydrocarbon group having one to six carbon atoms or a monovalent fluorinated alicyclic hydrocarbon group having four to twenty carbon atoms.

The above $R^J$ is preferably a hydrogen atom or a methyl group, more preferably a methyl group, in view of copolymerizability of the monomers giving the structural unit (f-1).

G is preferably —COO—, —SO$_2$NH—, —CONH—, or —OCONH—, more preferably —COO—.

Examples of the monovalent fluorinated chain hydrocarbon group having one to six carbon atoms represented by the above $R^K$ include a group in which a part or whole of the hydrogen atoms that the straight-chain or branched-chain alkyl group having one to six carbon atoms has are substituted with fluorine atoms.

Examples of the monovalent fluorinated alicyclic hydrocarbon group having four to twenty carbon atoms represented by the above $R^K$ include a group in which a part or whole of the hydrogen atoms that the monocyclic or polycyclic hydrocarbon group having four to twenty carbon atoms has are substituted with fluorine atoms.

$R^K$ is preferably a fluorinated chain hydrocarbon group, more preferably 2,2,2-trifluoroethyl group or 1,1,1,3,3,3-hexafluoro-2-propyl group, and still more preferably 2,2,2-trifluoroethyl group.

When the resin S has the structural units (f-1), a lower limit of the content of the structural unit (f-1) is preferably 10 mol %, more preferably 20 mol %, relative to the total structural units constituting the resin S. An upper limit of the content is preferably 100 mol %, more preferably 90 mol %. By setting the content of the structural unit (f-1) to be within the aforementioned range, the amount of the fluorine atoms contained in the resin S per unit mass can be more suitably adjusted.

[Structural Unit (f-2)]

The structural unit (f-2) is represented by the following Formula (f-2). When the resin S contains the structural unit (f-2), the solubility to the alkali development liquid is improved, and generation of development defects can be suppressed.

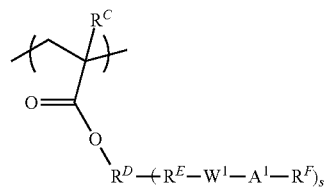

(f-2)

The structural unit (f-2) can be roughly classified into two, that are, (x) one having an alkali-soluble group and (y) one having a group that is dissociated by action of an alkali to increase the solubility to the alkali development liquid (which may hereafter be also referred to as "alkali-dissociative group"). In both of the cases (x) and (y), in the above Formula (f-2), $R^C$ is a hydrogen atom, a fluorine atom, a methyl group, or a trifluoromethyl group. $R^D$ is a single bond, a (s+1)-valent hydrocarbon group having one to twenty carbon atoms, a structure in which an oxygen atom, a sulfur atom, —NR$^{dd}$—, a carbonyl group, —COO—, or —CONH— is bonded to the terminal end on the $R^E$ side of this hydrocarbon group, or a structure in which a part of the hydrogen atoms that this hydrocarbon group has are substituted with an organic group having a heteroatom. $R^{dd}$ is a hydrogen atom or a monovalent hydrocarbon group having one to ten carbon atoms. Also, s is an integer of 1 to 3. However, when s is 1, $R^D$ in no cases is a single bond.

When the structural unit (f-2) is (x) one having an alkali-soluble group, $R^F$ is a hydrogen atom, and $A^1$ is an oxygen atom, —COO—*, or —SO$_2$O—*. The symbol * denotes the site bonded to $R^F$. W is a single bond, a hydrocarbon group having one to twenty carbon atoms, or a divalent fluorinated hydrocarbon group. When $A^1$ is an oxygen atom, $W^1$ is a fluorinated hydrocarbon group having a fluorine atom or a fluoroalkyl group at the carbon atom bonded to $A^1$. $R^E$ is a single bond or a divalent organic group having one to twenty carbon atoms. When s is 2 or 3, the plurality of $R^E$, $W^1$, $A^1$, and $R^F$ may each be the same or different. When the structural unit (f-2) has (x) an alkali-soluble group, the affinity to the alkali development liquid is enhanced, and development defects can be suppressed. The structural unit (f-2) having (x) an alkali-soluble group is particularly preferably a structural unit in which $A^1$ is an oxygen atom, and $W^1$ is 1,1,1,3,3,3-hexafluoro-2,2-methanediyl group.

When the structural unit (f-2) is (y) one having an alkali-dissociative group, $R^F$ is a monovalent organic group having one to thirty carbon atoms, and $A^1$ is an oxygen atom, —NR$^{aa}$—, —COO—*, or —SO$_2$O—*. $R^{aa}$ is a hydrogen atom or a monovalent hydrocarbon group having one to ten carbon atoms. The symbol * denotes the site bonded to $R^F$. $W^1$ is a single bond or a divalent fluorinated hydrocarbon group having one to twenty carbon atoms. $R^E$ is a single bond or a divalent organic group having one to twenty carbon atoms. When $A^1$ is —COO—* or —SO$_2$O—*, then $W^1$ or $R^F$ has a fluorine atom at the carbon atom bonded to $A^1$ or a carbon atom adjacent thereto. When $A^1$ is an oxygen atom, $W^1$ and $R^E$ are a single bond; $R^D$ is a structure in which a carbonyl group is bonded to the terminal end on the $R^E$ side of the hydrocarbon group having one to twenty carbon atoms; and $R^F$ is an organic group having a fluorine atom.

When s is 2 or 3, the plurality of $R^E$, $W^1$, $A^1$, and $R^F$ may each be the same or different. When the structural unit (f-2) has (y) an alkali-dissociative group, the resist film surface is turned from being hydrophobic to being hydrophilic in the alkali development step. As a result of this, the affinity to the development liquid is greatly enhanced, and development defects can be more efficiently suppressed. The structural unit (f-2) having (y) an alkali-dissociative group is particularly preferably a structural unit in which $A^1$ is —COO—*, and one or both of $R^F$ and $W^1$ have a fluorine atom.

$R^C$ is preferably a hydrogen atom or a methyl group, more preferably a methyl group, in view of copolymerizability of the monomers giving the structural unit (f-2), or the like.

When $R^E$ is a divalent organic group, a group having a lactone structure is preferable; a group having a polycyclic lactone structure is more preferable; and a group having a norbornane lactone structure is still more preferable.

When the resin S has the structural unit (f-2), a lower limit of the content of the structural unit (f-2) is preferably 0.1 mol %, more preferably 5 mol %, relative to the total structural units constituting the resin S. An upper limit of the content is preferably 50 mol %, more preferably 40 mol %. By setting the content of the structural unit (f-2) to be within the aforementioned range, the resist film surface formed from the photoresist composition can be more suitably changed from being water-repellent to being hydrophilic between before and after the alkali development.

A lower limit of the content of the structural unit (f) is preferably 10 mol %, more preferably 20 mol %, and still more preferably 25 mol %, relative to the total structural units constituting the resin S. An upper limit of the content is preferably 100 mol %, more preferably 90 mol %, and still more preferably 80 mol %.

A lower limit of the content of the structural unit containing an acid-dissociative group in the resin S is preferably 10 mol %, more preferably 20 mol %, and still more preferably 25 mol %, relative to the total structural units constituting the resin S. An upper limit of the content is preferably 90 mol %, more preferably 80 mol %, and still more preferably 75 mol %. By setting the content of the structural unit containing an acid-dissociative group to be within the aforementioned range, suppression of the development defects of the photoresist composition can be further improved.

When the photoresist composition contains the resin S, a lower limit of the content of the resin S is preferably 0.1 part by mass, more preferably 0.5 part by mass, still more preferably 1 part by mass, and particularly preferably 2 parts by mass, relative to 100 parts by mass of the resin P. An upper limit of the above content is preferably 30 parts by mass, more preferably 20 parts by mass, still more preferably 15 parts by mass, and particularly preferably 10 parts by mass. The photoresist composition may contain one kind or two or more kinds of the resin S.

The resin S can be synthesized by a method similar to that of the above-described resin P.

A lower limit of Mw of the resin S by GPC is preferably 1,000, more preferably 3,000, still more preferably 4,000, and particularly preferably 5,000. An upper limit of the above Mw is preferably 50,000, more preferably 30,000, still more preferably 20,000, and particularly preferably 10,000. By setting the Mw of the resin S to be within the aforementioned range, the application property of the photoresist composition and the suppression of the development defects are improved.

A lower limit of the ratio (Mw/Mn) of Mw to Mn of the resin S by GPC is typically 1, preferably 1.2. An upper limit of the above ratio is preferably 5, more preferably 3, and still more preferably 2.

The photoresist composition is prepared, for example, by dissolving the aforementioned resin P, acid generating agent Q, and optional acid diffusion controlling agent R and the like in accordance with the needs into a solvent. Also, the photoresist composition is used typically after being filtrated through a filter having a pore diameter of about 30 nm. The total solid component concentration of the photoresist composition is preferably 0.2 mass % to 20 mass % in view of the facility in application.

As an application method of the photoresist composition, a conventionally known application method such as rotation application, cast application, or roll application may be used. After the photoresist composition is applied onto the substrate, the substrate may be pre-baked (PB) in order to volatilize the solvent.

(Step (2))

In the step (2), the resist upper layer film forming resin composition is applied onto the resist film to form a liquid immersion upper layer film. As an application method of the upper layer film composition, a method similar to the application method of the photoresist composition in the step (1) may be used. In the present step, the substrate is preferably pre-baked (PB) after the upper layer film composition is applied. By forming a liquid immersion upper layer film on the resist film in this manner, the liquid immersion medium and the resist film are prevented from being in direct contact with each other, whereby decrease in the lithography performance of the resist film caused by penetration of the liquid medium into the resist film and contamination of the lens of the projection exposure apparatus by the components eluted from the resist film to the liquid medium are effectively suppressed.

The thickness of the formed liquid immersion upper layer film is preferably approximated to the odd-number times of $\lambda/4$ m (here, $\lambda$ is the wavelength of radiation, and m is the refractive index of the upper layer film) as much as possible. By doing so, the effect of suppressing reflection on the upper side interface of the resist film can be enlarged.

(Step (3))

In the step (3), the liquid immersion medium is placed on the liquid immersion upper layer film, and the resist film is subjected to liquid immersion exposure via this liquid immersion medium.

As the liquid immersion medium, a liquid having a higher refractive index than that of air is typically used. Water is preferably used as the liquid immersion medium, and pure water is more preferably used. Here, in accordance with the needs, the pH of the liquid immersion medium may be adjusted. An exposure light is radiated from the exposure apparatus in a state in which this liquid immersion medium is interposed, that is, in a state in which the gap between the lens of the exposure apparatus and the liquid immersion upper layer film is filled with the liquid immersion medium, so as to expose the liquid immersion upper layer film and the photoresist film via a mask having a predetermined pattern.

The exposure light used in this liquid immersion exposure can be suitably selected in accordance with the type of the photoresist film and the liquid immersion upper layer film, and examples thereof include visible light; ultraviolet rays such as a g-beam and an i-beam; far infrared rays such as an excimer laser; an X-ray such as a synchrotron radiation beam; and a charged particle beam such as an electron beam. Among these, an ArF excimer laser beam (wavelength of 193 nm) and a KrF excimer laser beam (wavelength of 248 nm) are preferable, and an ArF excimer laser beam is more preferable. Also, the conditions for radiation of the exposure light, for example, the exposure amount and the like, may be suitably set in accordance with the blending composition of the photoresist composition and the resist upper layer film forming resin composition, the type of the additives contained in these, and the like.

After the above liquid immersion exposure, the substrate is preferably subjected to post-exposure baking (PEB) in order to improve the resolution, the pattern shape, the development properties, and the like of the resulting resist pattern. The PEB temperature can be suitably set in accordance with the type and the like of the photoresist composition and the resist upper layer film forming resin composition that are put to use; however, the PEB temperature is typically 30° C. to 200° C., preferably 50° C. to 150° C. The PEB time is typically 5 seconds to 600 seconds, preferably 10 seconds to 300 seconds.

(Step (4))

In the step (4), the resist film subjected to the above liquid immersion exposure is developed. This can yield a desired resist pattern. According to the method of forming the resist pattern, the liquid immersion upper layer film is formed by using the upper layer film composition, so that the liquid immersion upper layer film can be easily removed by the development liquid during the development or by the washing liquid during the washing when washing is carried out after the development. In other words, there is no need of a separate peeling step for removing the liquid immersion upper layer film. In the present step, either alkali development or organic solvent development may be carried out. By the alkali development, a positive-type resist pattern is obtained. By the organic solvent development, a negative-type resist pattern is obtained. Among these, the alkali development is preferable.

When the alkali development is performed, the development liquid is preferably an alkaline aqueous solution in which at least one kind of alkaline compounds such as sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetraalkylammonium hydroxides (for example, tetramethylammonium hydroxide (TMAH), tetraethylammonium hydroxide, and the like), pyrrole, piperidine, choline, 1,8-diazabicyclo-[5.4.0]-7-undecene, and 1,5-diazabicyclo-[4.3.0]-5-nonane is dissolved. Among these, an aqueous solution of tetraalkylammonium hydroxides is preferable, and an aqueous solution of TMAH is more preferable.

A suitable amount of a water-soluble organic solvent such as an alcohol such as methanol or ethanol, or a surfactant, for example, may be added into the development liquid in the above alkali development.

Also, in the case of the organic solvent development, a development liquid containing an organic solvent is used. The organic solvent may be, for example, one similar to the solvent exemplified as the solvent contained in the resist upper layer film forming resin composition described above. Among these, an ether-based solvent, a ketone-based solvent, and an ester-based solvent are preferable, and n-butyl acetate, isopropyl acetate, amyl acetate, anisole, 2-butanone, methyl-n-butyl ketone, and methyl-n-amyl ketone are more preferable. One kind or two or more kinds of these organic solvents may be used.

The content of the organic solvent in the development liquid for the organic solvent development is preferably 80 mass % or more, more preferably 90 mass % or more, and still more preferably 100 mass %. By setting the content of the organic solvent in the development liquid to be within the aforementioned range, the dissolution contrast between the exposed part and the non-exposed part can be improved and, as a result of this, a resist pattern excellent in lithography characteristics can be formed. Examples of the components other than the organic solvent include water and silicone oil.

The resist film subjected to the above development is preferably washed with use of a rinsing liquid and dried. As the rinsing liquid, water is preferable in the case of the alkali development, and ultrapure water is more preferable. In the case of the organic solvent development, an organic solvent is preferable as the rinsing liquid, and an alcohol-based solvent is more preferable.

<Development Modifier>

The development modifier of the present embodiment contains the aforementioned resin composition. The effect of suppressing the residue defects by the resist upper layer film forming resin composition according to one embodiment of the present invention derives from the fact that the highly acidic resin contained in the resin composition and the resist film form a mixing layer, so that the aforementioned resin composition can be used as the development modifier in a process other than the liquid immersion exposure process. The higher the wiring density is, the larger the influence of the presence or absence of the residue defects on the product quality is. By using the development modifier containing the aforementioned resin composition in an extreme ultraviolet ray (EUV) or electron beam (EB) exposure process, the yield can be improved. In particular, when the resist film contains a fluorine-containing polymer, dissolution of the fluorine-containing polymer having a relatively lower solubility to the alkali development liquid can be promoted when the development modifier forms a mixing layer, so that a higher effect is expected in suppressing the residue defects.

Details of the resin composition contained in the development modifier, the preparation method thereof, and the method of forming the resist pattern are basically the same as in the case of the aforementioned resist upper layer film forming resin composition. Hereafter, only the different parts will be described.

<Method of Forming Resist Pattern>

A method of forming a resist pattern according to the present embodiment includes:

applying a photoresist composition on a substrate to form a resist film on the substrate;

exposing the resist film; and developing the exposed resist film with an alkali development liquid, and further includes applying the development modifier of the present embodiment on a surface of the resist film after the resist film is formed and before the exposed resist film is developed.

In the present forming method, the development modifier can be applied to a dry exposure process other than the liquid immersion exposure process. The resist film forming step, the exposure process, and the development step are the same as in the mode of using the upper layer film composition except that the liquid immersion exposure process is not used and that a radiation beam having a wavelength of 50 nm or less such as an EUV (extreme ultraviolet ray, wavelength: 13.5 nm) can be used as the exposure light in the exposure step.

In the present embodiment, the method further includes a step of applying the development modifier of the present embodiment on a surface of the resist film after the step of forming the resist film and before the step of developing the exposed resist film. The development modifier application step can be carried out irrespective of whether the development modifier application step is carried out before or after the exposure step, provided that the development modifier application is carried out between the resist film forming step and the development step. The application step is preferably carried out before the exposure step from the viewpoint of production efficiency and maintaining the state of the resist film after the exposure. As the application method, a procedure similar to that of the method for applying the upper layer film composition can be adopted.

EXAMPLES

Hereafter, the present invention will be described in detail by using Examples; however, the present invention is not limited to the following Examples unless the gist thereof is surpassed.

($^{13}$C-Nmr Analysis)

The $^{13}$C-NMR analysis was carried out using: a nuclear magnetic resistance apparatus (JNM-ECX400 manufactured by JEOL Ltd.); CDCl$_3$ as a measurement solvent; and tetramethylsilane (TMS) as an internal reference.

(Mw and Mn Measurement)

The Mw and Mn of the resin were measured by gel permeation chromatography (GPC) under the following conditions.

GPC column: two columns of G2000HXL, one column of G3000HXL, and one column of G4000HXL (manufactured by Tosoh Corporation)

Elution solvent: tetrahydrofuran
Flow rate: 1.0 mL/min
Column temperature: 40° C.
Reference material: monodispersed polystyrene
Detector: differential refractometer <Synthesis of Resin 1 for Photoresist Composition>

The monomers (M-1) to (M-3) represented by the following formula were used in synthesizing the resin 1.

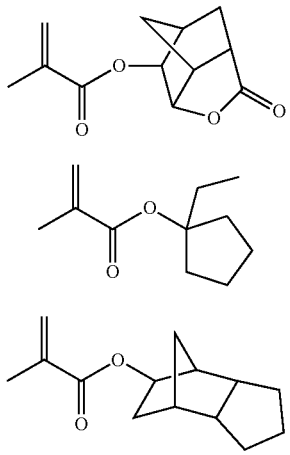

Synthesis Example 1

Into 200 g of 2-butanone, 53.93 g (50 mol %) of the compound (M-1), 35.38 g (40 mol %) of the compound (M-2), and 10.69 g (10 mol %) of the compound (M-3) were dissolved, and further, 5.58 g of dimethyl 2,2'-azobis(2-methylpropionate) was put to prepare a monomer solution. A three-neck flask of 500 mL into which 100 g of 2-butanone had been put was purged with nitrogen for 30 minutes. After purging with nitrogen, the reaction tank was heated to 80° C. while stirring, and the above monomer solution prepared in advance was dropwise added with use of a dropping funnel over three hours. Assuming that the start of dropwise addition was the start of polymerization, the polymerization reaction was carried out for six hours. After the polymerization ended, the polymerization solution was cooled with water to a temperature of 30° C. or lower and put into 2,000 g of methanol, so as to filtrate the deposited white powder. The filtrated white powder was washed for two times each with use of 400 g of methanol into a slurry form, thereafter filtrated, and dried at 50° C. for 17 hours to obtain a white powder resin 1 (74 g, yield of 74%).

This resin 1 was a copolymer in which Mw was 6,900; Mw/Mn was 1.70; and the content ratio of each of the structural units derived from the compound (M-1), the compound (M-2), and the compound (M-3) was 53.0:37.2:9.8 (mol %) as a result of $^{13}$C-NMR analysis. Here, the content of the low-molecular-weight components derived from each monomer in the polymer was 0.03 mass % relative to 100 mass % of the polymer.

<Preparation of Photoresist Composition 1>

A mixture was prepared using 100 parts by mass of the resin 1, 1.5 parts by mass of triphenylsulfonium nonafluoro-n-butanesulfonate and 6 parts by mass of 1-(4-n-butoxynaphthalene-1-yl)tetrahydrothiophenium nonafluoro-n-butanesulfonate as an acid generating agent, and 0.65 part by mass of R-(+)-(tert-butoxycarbonyl)-2-piperidinemethanol as an acid diffusion controlling agent. Into this mixture, 2,900 parts by mass of propylene glycol monomethyl ether acetate, 1,250 parts by mass of cyclohexanone, and 100 parts by mass of γ-butyrolactone as solvents were added and prepared, followed by filtration with a filter having a pore diameter of 30 nm to prepare a photoresist composition 1.

<Synthesis of Resins A to C in Resist Upper Layer Film Forming Resin Composition>

The monomers (M-5) to (M-10) represented by the following formula were used in synthesizing the resins A to C.

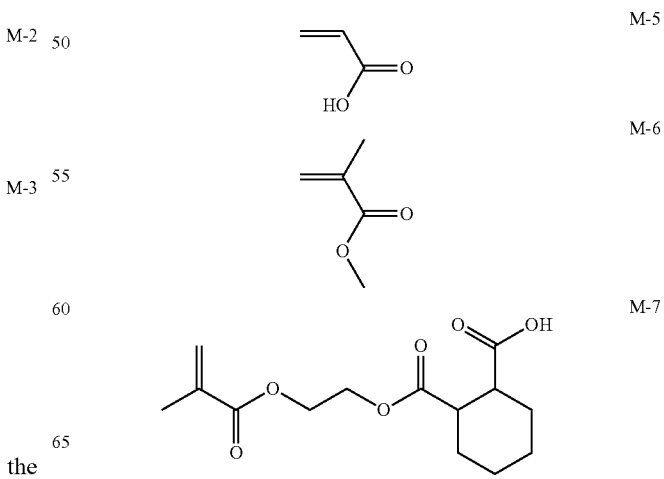

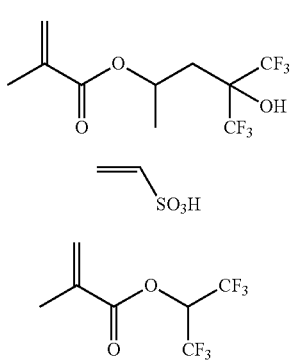

(Synthesis Example 2: Synthesis of Resin (A-1))

6.2 g of the compound (M-5), 15.9 g of the compound (M-6), and 7.9 g of the compound (M-9) as well as 3.6 g of 2,2-azobis (methyl 2-methylisopropionate) as a polymerization initiator were dissolved into 30 g of isopropanol to prepare A monomer solution. On the other hand, 30 g of isopropanol was put into a three-neck flask of 200 mL equipped with a thermometer and a dropping funnel, and the flask was purged with nitrogen for 30 minutes. After the purging with nitrogen, the inside of the flask was heated to attain a temperature of 80° C. while stirring with a magnetic stirrer, and the monomer solution prepared in advance was dropwise added with use of the dropping funnel over three hours. After the dropwise addition ended, the reaction was further continued for three hours. By cooling to attain 30° C. or lower, a polymerization reaction liquid was obtained. The polymerization liquid was concentrated to attain 60 g, and 60 g of methanol and 360 g of n-hexane were put into the concentrated liquid and put into a separation funnel, so as to perform separation purification. After the separation, the lower layer was collected. The collected lower layer liquid was substituted with 4-methyl-2-pentanol; the whole amount was adjusted to 256 g; and separation purification with 128 g of methanol and 256 g of pure water was carried out, so as to collect 280 g of the upper layer. To this upper layer, 140 g of 2-butanone and 280 g of pure water were added and stirred for 30 minutes. Thereafter, 400 g of the upper layer was collected and substituted with 4-methyl-2-pentanol, so as to obtain a solution containing the resin (A-1) (yield of 52%).

In the obtained resin (A-1), Mw was 4,500 and Mw/Mn was 1.6. The contents of the respective structural units derived from (M-5), (M-6), and (M-9) were 30 mol %, 62 mol %, and 8 mol %, respectively, as a result of $^{13}$C-NMR analysis.

(Synthesis Examples 3 to 7: Synthesis of Resins (A-2) to (A-3) and Resins (B-1) to (B-3))

The resins (A-2) to (A-3) and the resins (B-1) to (B-3) were synthesized by a procedure similar to that of the resin (A-1) except that the monomers were blended to attain a composition shown in Table 1.

(Synthesis Example 8: Synthesis of Resin (C-1))

50 g of the compound (M-8) and 1.95 g of 2,2-azobis (methyl 2-methylisopropionate) were dissolved into 50 g of 2-butanone to prepare a monomer solution in advance. On the other hand, 50 g of 2-butanone was put into a three-neck flask of 500 mL equipped with a thermometer and a dropping funnel, and the flask was purged with nitrogen for 30 minutes. After the purging with nitrogen, the inside of the flask was heated to attain a temperature of 80° C. while stirring with a magnetic stirrer, and the monomer solution prepared in advance was dropwise added with use of the dropping funnel over two hours. After the dropwise addition ended, the reaction was further continued for two hours, and 1.17 g of 2,2-azobis (methyl 2-methylisopropionate) was further added, so as to continue the reaction for further two hours. By cooling to attain 30° C. or lower, a polymerization reaction liquid was obtained. Subsequently, the obtained polymerization liquid was transferred to a separation funnel, and 50 g of methanol and 600 g of n-hexane were put into the separation funnel, so as to perform separation purification. After the separation, the lower layer was collected. The lower layer liquid was diluted with 2-butanone to attain 100 g, and the resultant was transferred again to the separation funnel. Into the separation funnel, 50 g of methanol and 600 g of n-hexane were put, and the separation purification was carried out again. After the separation, the lower layer was collected. The collected lower layer liquid was substituted with 4-methyl-2-pentanol; the whole amount was adjusted to 250 g; and separation purification with 250 g of water was carried out, so as to collect the upper layer, which was then substituted with 4-methyl-2-pentanol again, so as to obtain a solution containing the resin (C-1) (yield of 77%).

In the resin (C-1), Mw was 12,130 and Mw/Mn was 1.65.

(Synthesis Example 9: Synthesis of Resin (C-2))

25.0 g of 2,2-azobis (methyl 2-methylisopropionate) as a polymerization initiator was dissolved into 25.0 g of 2-butanone to prepare a polymerization initiator solution. On the other hand, 166.4 g (50 mol %) of the compound (M-8), 133.6 g (50 mol %) of the compound (M-10), and 575.0 g of 2-butanone were put into a three-neck flask of 2,000 mL equipped with a thermometer and a dropping funnel, and the flask was purged with nitrogen for 30 minutes. After the purging with nitrogen, the inside of the flask was heated to attain a temperature of 80° C. while stirring with a magnetic stirrer. Next, the prepared polymerization initiator solution was dropwise added in five minutes with use of the dropping funnel and aged for 6 hours. Thereafter, the resultant was cooled to 30° C. or lower to obtain a polymerization reaction liquid. Subsequently, the obtained polymerization reaction liquid was concentrated to 600 g and then transferred to a separation funnel. Into this separation funnel, 193 g of methanol and 1,542 g of n-hexane were put, so as to perform separation purification. After the separation, the lower layer liquid was collected. Into the lower layer liquid, 117 g of 2-butanone and 1,870 g of n-hexane were put, so as to perform separation purification. After the separation, the lower layer liquid was collected. Further, 93 g of methanol, 77 g of 2-butanone, and 1,238 g of n-hexane were put into the collected lower layer liquid, so as to perform separation purification. After the separation, the lower layer liquid was collected. The collected lower layer liquid was substituted with 4-methyl-2-pentanol, and this solution was washed with distilled water and substituted with 4-methyl-2-pentanol again, so as to obtain a solution containing the resin (C-2) (yield of 79%).

In the resin (C-2), Mw was 7,700 and Mw/Mn was 1.61. The contents of the respective structural units derived from (M-8) and (M-10) were 51 mol % and 49 mol %, respectively, as a result of $^{13}$C-NMR analysis.

(Synthesis Example 10: Synthesis of Resin (C-3))

The resin (C-3) was synthesized by a procedure similar to that of the resin (C-2) except that the monomers were blended to attain a composition shown in Table 1.

needle, and a water droplet of 25 µL was formed on the wafer. Then, the needle was temporarily drawn out from the water droplet, and the needle was pulled down at the initial position again and placed in the water droplet. Subsequently, the water droplet was sucked with the needle for 90 seconds at a speed of 10 µL/min and, at the same time, the contact angle was measured once per second for a sum of 90 times. Among these, an average value of the contact angles for 20

TABLE 1

| | | Monomers | | | | | Amount of fluorine atoms per unit mass | Yield | Physical property values | |
|---|---|---|---|---|---|---|---|---|---|---|
| | | Content | | Content | | Content | | | | |
| | Resin | Type | (mol %) | Type | (mol %) | Type | (mol %) | (mass %) | (%) | Mw | Mw/Mn |
| Synthesis Example 2 | Resin A-1 | M-5 | 30 | M-6 | 62 | M-9 | 8 | 0 | 52 | 4,500 | 1.60 |
| Synthesis Example 3 | Resin A-2 | M-5 | 72 | M-8 | 18 | M-9 | 10 | 17.6 | 57 | 4,100 | 1.65 |
| Synthesis Example 4 | Resin A-3 | M-7 | 90 | M-9 | 10 | — | — | 0 | 55 | 4,400 | 1.59 |
| Synthesis Example 5 | Resin B-1 | M-5 | 30 | M-6 | 68 | M-9 | 2 | 0 | 72 | 8,250 | 1.55 |
| Synthesis Example 6 | Resin B-2 | M-8 | 98 | M-9 | 2 | — | — | 38 | 79 | 7,950 | 1.50 |
| Synthesis Example 7 | Resin B-3 | M-7 | 96 | M-9 | 4 | — | — | 0 | 76 | 7,650 | 1.52 |
| Synthesis Example 8 | Resin C-1 | M-8 | 100 | — | — | — | — | 38.3 | 77 | 12,130 | 1.65 |
| Synthesis Example 9 | Resin C-2 | M-8 | 51 | M-10 | 49 | — | — | 42.8 | 79 | 7,700 | 1.61 |
| Synthesis Example 10 | Resin C-3 | M-8 | 40 | M-10 | 60 | — | — | 43.9 | 82 | 8,600 | 1.60 |

<Preparation of Resist Upper Layer Film Composition>

Example 1

A mixture was prepared using 4 parts by mass of the resin (A-1), 76 parts by mass of the resin (C-1), and 20 parts by mass of the resin (C-2). Into this mixture, 2,500 parts by mass of 4-methyl-2-pentanol and 2,500 parts by mass of diisoamyl ether were added as solvents, followed by filtration with a filter having a pore diameter of 30 nm, so as to prepare a resist upper layer film forming resin composition of the Example 1.

Examples 2 to 11 and Comparative Examples 1 to 2

A resist upper layer film forming resin composition was prepared in the same manner as in the Example 1 except that the composition shown in the following Table 2 was used.
<Evaluation>
The following items were evaluated with respect to the obtained resist upper layer film forming resin compositions.
(Receding Contact Angle of Water)
The receding contact angle value of water on the upper layer film surface was measured. An 8-inch silicon wafer was spin-coated with the resist upper layer film forming resin composition and pre-baked (PB) at 90° C. for 60 seconds on a hot plate, thereby to form an upper layer film having a film thickness of 30 nm. Thereafter, the receding contact angle was measured by the following procedure quickly in an environment with a room temperature of 23° C., a humidity of 45%, and an ordinary pressure with use of a contact angle meter (DSA-10 manufactured by KRUS). First, the wafer stage position of the above contact angle meter was adjusted, and the above wafer was set on the adjusted stage. Next, water was injected into a needle, and the position of the needle was finely adjusted to an initial position at which a water droplet could be formed on the above set wafer. Thereafter, water was discharged from this needle, and a water droplet of 25 µL was formed on the wafer. Then, the needle was temporarily drawn out from the water droplet, and the needle was pulled down at the initial position again and placed in the water droplet. Subsequently, the water droplet was sucked with the needle for 90 seconds at a speed of 10 µL/min and, at the same time, the contact angle was measured once per second for a sum of 90 times. Among these, an average value of the contact angles for 20 seconds from the time point at which the measured value of the contact angle became stable was calculated, so as to determine the receding contact angle (unit: degrees))(°.
(Water Mark Defects, Residue Defects)
The water mark defects and residue defects on the resist pattern obtained by exposure/development of the photoresist on which the upper layer film had been formed were evaluated. A 12-inch silicon wafer surface was spin-coated with a lower layer reflection preventive film (ARC66 manufactured by Nissan Chemical Corporation) with use of an application/development apparatus (Lithius Pro-i manufactured by Tokyo Electron Ltd.) and thereafter pre-baked (PB) to form a lower layer reflection preventive film having a film thickness of 105 nm. Subsequently, with use of the above application/development apparatus, the wafer was spin-coated with each photoresist and pre-baked (PB) at 90° C. for 60 seconds, followed by cooling at 23° C. for 30 seconds to form a photoresist film having a film thickness of 90 nm. Thereafter, an upper layer film forming resin composition was applied onto this resist film and pre-baked (PB) at 90° C. for 60 seconds to form an upper layer film having a film thickness of 30 nm. Next, exposure was carried out via a mask for forming a pattern with a 45 nm line/90 nm pitch under the optical conditions with NA: 1.30, Dipole with use of an ArF liquid immersion exposure apparatus (S610C manufactured by Nikon Corporation). Thereafter, the PIR (washing after exposure) step was omitted, and the wafer was subjected to post-exposure baking (PEB) at 90° C. for 60 seconds on a hot plate, followed by cooling at 23° C. for 30 seconds. Thereafter, paddle development was carried out for 10 seconds using a 2.38% aqueous solution of TMAH as a development liquid, and the wafer was spin-dried by swinging at 2000 rpm for 15 seconds, so as to obtain a substrate on which the resist pattern had been formed. The obtained substrate on which the resist pattern had been formed was subjected to a defect test with use of a defect testing apparatus (KLA2810 manufactured by KLA-Tencor Corporation) and observed with use of a scanning electron microscope (RS6000 manufactured by Hitachi High-Technologies Corporation), so as to evaluate the water mark defects and residue defects according to the following evaluation standards.

<Evaluation Standard of Water Mark Defects>
○: the number of water mark defects was 0 per one wafer
Δ: the number of water mark defects was one or two per one wafer
x: the number of water mark defects was 3 or more per one wafer <Evaluation Standard of Residue Defects>
○: the number of residue defects was less than 100 per one wafer
x: the number of residue defects was 100 or more per one wafer

TABLE 2

| | Resist upper layer film forming composition | | | | | | | | Evaluation results | | |
|---|---|---|---|---|---|---|---|---|---|---|---|
| | Resin A | | Resin B | | Resin C | | Solvent D | | Receding | | |
| | Type | Content (parts by mass) | Type | Content (parts by mass) | Type | Content (parts by mass) | Type | Content (parts by mass) | Contact angle [°] | Water mark defects | Residue defects |
| Example 1 | A-1 | 4 | — | — | C-1/C-2 | 76/20 | D-1/D-2 | 2500/2500 | 81 | ○ | ○ |
| Example 2 | A-2 | 4 | — | — | C-1/C-2 | 76/20 | D-1/D-2 | 1000/4000 | 81 | ○ | ○ |
| Example 3 | A-1 | 2 | B-1 | 18 | C-1/C-2 | 60/20 | D-1/D-2 | 2500/2500 | 80 | ○ | ○ |
| Example 4 | A-2 | 2 | B-2 | 18 | C-1/C-2 | 60/20 | D-1/D-2 | 1000/4000 | 80 | ○ | ○ |
| Example 5 | A-1 | 2 | B-2 | 78 | C-2 | 20 | D-1/D-2 | 2500/2500 | 81 | ○ | ○ |
| Example 6 | A-1 | 1 | B-1 | 29 | C-1/C-3 | 55/15 | D-1/D-2 | 1000/4000 | 84 | ○ | ○ |
| Example 7 | A-3 | 2 | B-2 | 78 | C-3 | 20 | D-1/D-2 | 2500/2500 | 84 | ○ | ○ |
| Example 8 | A-1 | 2 | B-3 | 18 | C-1/C-2 | 60/20 | D-1/D-2 | 2500/2500 | 81 | ○ | ○ |
| Example 9 | A-3 | 4 | B-2 | 56 | C-1/C-2 | 20/20 | D-1/D-2 | 2500/2500 | 81 | ○ | ○ |
| Example 10 | A-1 | 15 | B-2 | 10 | C-1/C-3 | 55/20 | D-1/D-2 | 2500/2500 | 76 | Δ | ○ |
| Example 11 | A-3 | 10 | B-2 | 5 | C-1/C-3 | 65/20 | D-1/D-2 | 2500/2500 | 77 | Δ | ○ |
| Comparative Example 1 | A-1 | 60 | — | — | C-1/C-2 | 20/20 | D-1/D-2 | 2500/2500 | 72 | x | ○ |
| Comparative Example 2 | | | B-3 | 4 | C-1/C-2 | 76/20 | D-1/D-2 | 2500/2500 | 81 | ○ | x |

From the results of Table 2, it will be understood that a resist upper layer film excellent in both of residue defect preventability and water mark defect preventability can be formed by using the resist upper layer film forming resin composition of the Examples. Here, in the Examples 10 and 11, a slight amount of water mark defects were generated. This seems to be caused by the fact that the content of the highly acidic resin A in the composition was comparatively large, and the water repellency of the obtained upper layer film was decreased a little. From the comparison between the Examples 3 to 9 and the Examples 10 to 11, it can be stated that the content of the resin A is preferably smaller than the content of the resin B in view of each of the contents of the resin A and the resin B in the composition. Also, from the comparison between the Examples 1 to 9 and the Examples 10 to 11, it can be stated that the content of the resin A in the composition preferably is relatively smaller as compared with other resins, and is preferably less than 5 mass %.

Obviously, numerous modifications and variations of the present invention are possible in light of the above teachings. It is therefore to be understood that within the scope of the appended claims, the invention may be practiced otherwise than as specifically described herein.

What is claimed is:

1. A method of forming a resist pattern, comprising:
    applying a photoresist composition on a substrate to form a resist film on the substrate;
    applying a resin composition on the resist film to form a liquid immersion upper layer film on the resist film;
    performing liquid immersion exposure on the resist film on which the liquid immersion upper layer film is formed; and
    developing the resist film after the liquid immersion exposure,
    wherein the resin composition comprises:
        a resin A that comprises a sulfonic-acid-group-containing structural unit in an amount exceeding 5 mol % with respect to total structural units included in the resin A, the resin A having a content of a fluorine atom of 30 mass % or less with respect to a total mass of the resin A;
        a resin C that comprises a fluorine atom in a larger content per unit mass than the content of a fluorine atom per unit mass in the resin A; and
        a solvent,
    wherein a content of the resin A in the resin composition is lower than a content of the resin C in the resin composition in terms of mass, and
    wherein a content of the resin A in a total mass of resin solid components of the resin composition is 0.1 mass % or more and less than 5 mass %.

2. The method according to claim 1, wherein a content of the resin C in the total mass of resin solid components of the resin composition is 10 mass % or more and 98 mass % or less.

3. The method according to claim 1, wherein
    an amount of a fluorine atom in the resin A with respect to a total mass of the resin A is 0 mass % or more and less than 30 mass %, and
    an amount of a fluorine atom in the resin C with respect to a total mass of the resin C exceeds 40 mass %.

4. The method according to claim 3, wherein the resin A does not contain a fluorine atom.

5. The method according to claim 1, wherein the resin composition further comprises a resin B that comprises a sulfonic-acid-group-containing structural unit in an amount exceeding 0 mol % and being 5 mol % or less with respect to total structural units included in the resin B, the resin B having a content of a fluorine atom per unit mass smaller than the content of a fluorine atom per unit mass in the resin C.

6. The method according to claim 5, wherein the sulfonic-acid-group-containing structural unit in one or both of the resin A and the resin B is represented by formula (1):

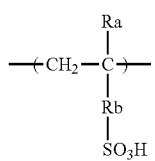

wherein in the formula (1), Ra is a hydrogen atom or a methyl group, and Rb is a single bond or a divalent organic group.

7. The method according to claim 1, wherein the resin C does not contain a sulfonic-acid-group-containing structural unit.

8. The method according to claim 1, wherein the resin A further comprises a carboxyl-group-containing structural unit.

9. The method according to claim 1, wherein a receding contact angle of a film formed from the resin composition, with respect to water, is 80° or more.

10. The method according to claim 1, wherein the sulfonic-acid-group-containing structural unit in the resin A is represented by formula (1):

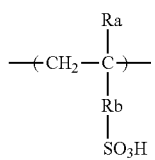

wherein in the formula (1), Ra is a hydrogen atom or a methyl group, and Rb is a single bond or a divalent organic group.

11. A method of forming a resist pattern, comprising:
applying a photoresist composition on a substrate to form a resist film on the substrate;
exposing the resist film; and
developing the exposed resist film with an alkali development liquid,
the method further comprising applying a resin composition on a surface of the resist film after the resist film is formed and before the exposed resist film is developed,
wherein the resin composition comprises:
a resin A that comprises a sulfonic-acid-group-containing structural unit in an amount exceeding 5 mol % with respect to total structural units included in the resin A, the resin A having a content of a fluorine atom of 30 mass % or less with respect to a total mass of the resin A;
a resin C that comprises a fluorine atom in a larger content per unit mass than the content of a fluorine atom per unit mass in the resin A; and
a solvent,
wherein a content of the resin A in the resin composition is lower than a content of the resin C in the resin composition in terms of mass, and
wherein a content of the resin A in a total mass of resin solid components of the resin composition is 0.1 mass % or more and less than 5 mass %.

12. The method according to claim 11, wherein the exposing of the resist film is carried out with an extreme ultraviolet ray.

13. The method according to claim 11, wherein the photoresist composition comprises a fluorine-atom-containing polymer.

14. The method according to claim 11, wherein a content of the resin C in the total mass of resin solid components of the resin composition is 10 mass % or more and 98 mass % or less.

15. The method according to claim 11, wherein
an amount of a fluorine atom in the resin A with respect to a total mass of the resin A is 0 mass % or more and less than 30 mass %, and
an amount of a fluorine atom in the resin C with respect to a total mass of the resin C exceeds 40 mass %.

16. The method according to claim 15, wherein the resin A does not contain a fluorine atom.

17. The method according to claim 11, wherein the resin composition further comprises a resin B that comprises a sulfonic-acid-group-containing structural unit in an amount exceeding 0 mol % and being 5 mol % or less with respect to total structural units included in the resin B, the resin B having a content of a fluorine atom per unit mass smaller than the content of a fluorine atom per unit mass in the resin C.

18. The method according to claim 17, wherein the sulfonic-acid-group-containing structural unit in one or both of the resin A and the resin B is represented by formula (1):

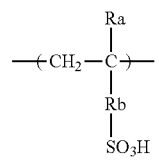

wherein in the formula (1), Ra is a hydrogen atom or a methyl group, and Rb is a single bond or a divalent organic group.

19. The method according to claim 11, wherein the resin C does not contain a sulfonic-acid-group-containing structural unit.

20. The method according to claim 11, wherein the resin A further comprises a carboxyl-group-containing structural unit.

21. The method according to claim 11, wherein a receding contact angle of a film formed from the resin composition, with respect to water, is 80° or more.

22. The method according to claim 11, wherein the sulfonic-acid-group-containing structural unit in the resin A is represented by formula (1):

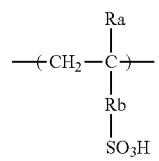

wherein in the formula (1), Ra is a hydrogen atom or a methyl group, and Rb is a single bond or a divalent organic group.

* * * * *